United States Patent [19]

Berlin et al.

[11] Patent Number: 6,104,082
[45] Date of Patent: Aug. 15, 2000

[54] METALLIZATION STRUCTURE FOR ALTERING CONNECTIONS

[75] Inventors: Claude L. Berlin, South Burlington; Wayne J. Howell, Williston, both of Vt.

[73] Assignee: International Business Machines Corporation, Armonk, N.Y.

[21] Appl. No.: 09/066,147

[22] Filed: Apr. 24, 1998

[51] Int. Cl.[7] .................................................. H01L 23/58
[52] U.S. Cl. ............................ 257/665; 257/48; 257/723
[58] Field of Search .................................. 257/686, 723, 257/48, 665

[56] References Cited

U.S. PATENT DOCUMENTS

| | | |
|---|---|---|
| 4,489,364 | 12/1984 | Chance et al. . |
| 4,811,082 | 3/1989 | Jacobs et al. . |
| 4,840,924 | 6/1989 | Kinbara . |
| 4,862,243 | 8/1989 | Welch et al. . |
| 4,984,054 | 1/1991 | Yamada et al. . |
| 5,011,067 | 4/1991 | Foisy . |
| 5,049,969 | 9/1991 | Orbach et al. . |
| 5,107,586 | 4/1992 | Eichelberger et al. ................... 29/830 |
| 5,220,490 | 6/1993 | Weigler et al. . |
| 5,260,597 | 11/1993 | Orbach et al. . |
| 5,294,754 | 3/1994 | Wu . |
| 5,331,195 | 7/1994 | Yukihiro . |
| 5,414,637 | 5/1995 | Bertin et al. . |
| 5,465,004 | 11/1995 | Lim et al. . |
| 5,473,196 | 12/1995 | De Givry . |
| 5,475,236 | 12/1995 | Yoshizaki ................................. 257/48 |
| 5,502,333 | 3/1996 | Bertin et al. . |
| 5,529,950 | 6/1996 | Hoenlein et al. . |
| 5,786,628 | 8/1998 | Beilstein, Jr. et al. ................. 257/686 |

*Primary Examiner*—Carl Whitehead, Jr.
*Assistant Examiner*—Roy Potter
*Attorney, Agent, or Firm*—James M. Leas

[57] ABSTRACT

A tailorable metallization level between a first set of pads connected to internal circuits of an electronic structure and a second set of pads for external connection provides for altering the configuration of the electronic structure. The second set of pads is kept invariant to facilitate external connection to the electronic structure. The reconfiguration scheme provides, in one embodiment, for sparing a stacked arrangement of chips. That is, it provides a way to disconnect a defective chip from a stack of chips and connect a spare chip so that, from the point of view of external circuitry, there is no change in the connection to or function of the stack. The invention also provides for changing the logical arrangement of circuits in a single chip, such as the organization of memory I/O.

22 Claims, 28 Drawing Sheets

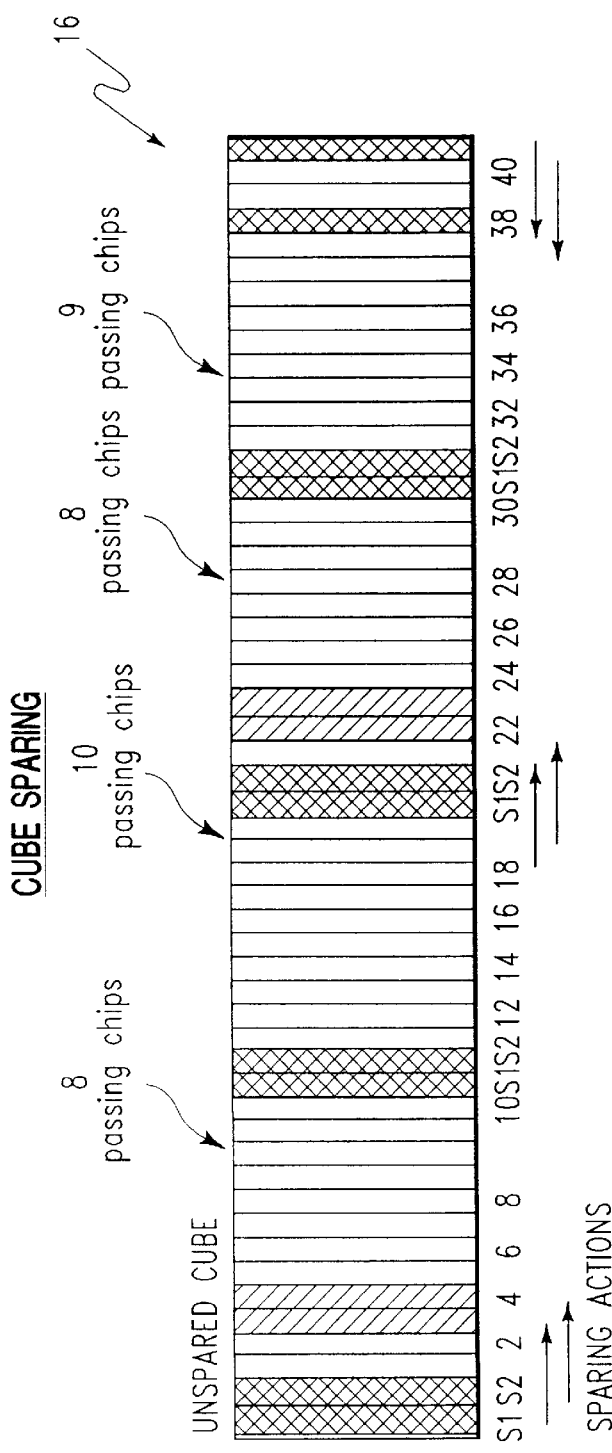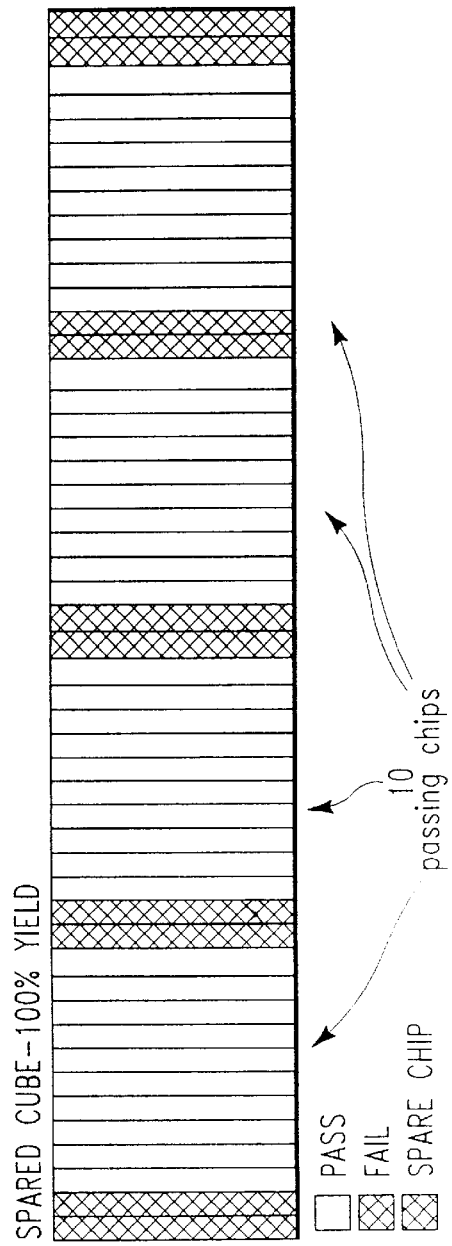
FIG. 1a  FIG. 1a'

Stepping Patterns Used to Connect Spare Chip S to Bump Position 22 and Spare Chip S1 to Bump Position 23

| Pattern # | Chip S1 |   |   |   | Chip 21 |   |   |   | Chip 22 |   |   |   | Chip 23 |   |   |   |
|---|---|---|---|---|---|---|---|---|---|---|---|---|---|---|---|---|
|  | E | E1 | E2 | E3 | E | E1 | E2 | E3 | E | E1 | E2 | E3 | E | E1 | E2 | E3 | E |
| 102 |   | X |   |   |   |   |   |   |   |   |   |   |   |   |   |   |   |
| 103 |   |   | X |   |   |   | X |   |   |   |   |   |   |   |   |   |   |
| 104 |   |   |   |   |   | O |   |   |   |   | X O |   |   |   |   |   |   |
| 105 |   |   |   |   |   |   | X O |   |   |   | X O |   |   |   |   | O |   |
| 106 |   |   |   |   |   |   |   |   |   |   |   | X |   | O |   |   |   |
| 107 |   |   | □ ◁ |   |   |   | □ ◁ |   |   |   |   |   |   |   |   | O |   |

101

Stepped Exposures Coded by Function
X I/O Connections: Spare chip S to Bump Position 22
O I/O Connections: Spare chip S1 to Bump Position 23
□ Signal Lines extended to spare chips S & S1 (Ex: address lines)
◁ Power Supply line(s) extended to spare chips S & S1
(Ground is connected to all chips)

Note: Pattern Exposes the entire cube face simultaneously, no stepping required E, E1, E2, E3 are exposure positions. Table gives position, pattern, function

Stepping Patterns Used to Connect I/O of Spare Chip S to Bump Position 22 and I/O Spare Chip S1 to Bump Position 23 & to Connect 4 Separate Chip I/C as one COMMON I/O

| Pattern # | Chip 18 | | | | Chip 19 | | | | Chip 20 | | | | S Chip | | | | Chip S1 | | | | Chip 21 | | | | Chip 22 | | | | Chip 23 | | | |
|---|---|---|---|---|---|---|---|---|---|---|---|---|---|---|---|---|---|---|---|---|---|---|---|---|---|---|---|---|---|---|---|---|
| | E3 | E | E1 | E2 | E3 | E | E1 | E2 | E3 | E | E1 | E2 | E3 | E | E1 | E2 | E3 | E | E1 | E2 | E3 | E | E1 | E2 | E3 | E | E1 | E2 | E3 | E | E1 | E2 |
| 112 | | | | | | | | | | | | | | | | | X | | | | | | X | | | | X | | | | X | |
| 113 | | | | | | | | | | | | | | | X | | | | X | | | O | | | | O | | | | O | | |
| 114 | | | | | | | | | | | | | | | | | | O | | | | | O | | | | O | | | | O | |
| 115 | | | | | | | | | | | | | | | | | | | | | | | | | | | | | | | | |
| 116 | □ | | | | □ | | | | □ | | | | □ | | | | | | | | □ | | | | □ | | | | □ | | | |

Stepped Exposures Coded by Function
X I/O Connections: Spare chip S to Bump Position 22
O I/O Connections: Spare chip S1 to Bump Position 23
□ I/O Connections: Connects 4 separate chip I/Os to 1 common I/O Note: Pattern 111 Exposes the entire cube face simultaneously, no stepping required E, E1, E2, E3 are exposure positions. Table gives position, pattern, function

METALLIZATION STRUCTURE FOR ALTERING CONNECTIONS

FIELD OF THE INVENTION

This invention generally relates to structures for altering completed integrated circuit chips. More particularly, it relates to structures that permit changing connections to integrated circuit chips. Even more particularly, it relates to structures that permit replacing defective chips with functional chips. Even more particularly, it relates to structures for sparing a stack of integrated circuit chips.

BACKGROUND OF THE INVENTION

Stacked chip arrangements can provide significant advantage in packing density and performance. The closest packing density is achieved where the chips are glued directly to each other. However, chip reliability is much more important in this arrangement since a short anyplace on the stack can render the entire stack defective. Schemes to disconnect shorted chips and connect spare good chips have been proposed. One scheme, described in commonly assigned U.S. Pat. No. 5,414,637 to Bertin et al, requires an additional thin film metal layer, an insulation layer, and a via there between on the side face of the stack, adding significantly to process complexity and cost. Another, described in commonly assigned U.S. Pat. No. 5,661,330, to Aimi, et al., provides fuses for each pad of the stack. These schemes both provide that the stack pad layout changes depending on which chips of the stack are being used, raising the cost of making connection to the stack. These schemes have also provided several major manufacturing steps after repair is complete, introducing the possibility of defects that could require further repair.

Thus, a better solution is needed that provides the ability to replace shorted chips using simple steps after all other manufacturing steps are complete.

SUMMARY OF THE INVENTION

It is therefore an object of the present invention to provide an invariant pad arrangement for a customer to connect to the next level of packaging while providing for routing of wiring between those pads and circuits in the electronic module after the circuits have been tested.

It is a further object of the present invention to provide a single set of contact pads for connection to an electronic module while providing reroutable wiring extending between those contact pads and the electronic module for reconfiguring circuitry on that module.

It is a further object of the present invention to provide a single set of contact pads for connection to a stack of chips while providing reroutable wiring extending between those contact pads and the several chips of the stack.

It is a further object of the present invention to provide a structure for rerouting wiring to disconnect a defective chip on an electronic module and to connect a spare chip on the electronic module.

It is a further object of the present invention to provide a structure for rerouting wiring to alter the logic of an electronic module.

It is another object of the present invention to provide a sparing arrangement that maintains the pattern of external contacts invariant.

It is a feature of the present invention that the sparing scheme includes a plurality of fused metal lines interconnecting pads.

It is a feature of the present invention that an alterable wiring level is provided on an electronic module that permits changing connections while retaining a constant interface to the electronic module.

It is an advantage of the present invention that interconnections among chips of an electronic module can be tailored without changing connection to the electronic module.

It is an advantage of the present invention that interconnections among circuits of an electronic module can be tailored after the circuits have been tested.

These and other objects, features, and advantages of the invention are accomplished by a wiring structure for configuring integrated circuit elements to avoid defective elements, comprising: m integrated circuit elements, wherein a portion of said elements are defective; a first arrangement of m pads, each of said m pads having a link to one of said integrated circuit elements; a second arrangement of n pads, m being greater than n, each of said n pads being connected to one of said m pads, each of said n pads of said second arrangement of pads in a fixed location; and a tailorable wiring level for connecting any n of said m pads of said first arrangement of pads to said n pads of said second arrangement of pads to avoid said defective elements.

In another aspect, the invention is a method of forming a wiring structure for integrated circuit elements, comprising the steps of:

(a) providing m integrated circuit elements;

(b) providing a first arrangement of m pads, each of said m pads having a link to one of said integrated circuit elements;

(c) testing said integrated circuit elements through said first arrangement of pads;

(d) providing a second arrangement of n pads, m being greater than n;

(e) providing a tailorable wiring level capable of connecting any n of said first arrangement of m pads to said second arrangement of n pads; and (f) tailoring said tailorable wiring level to provide connections of a specific n pads of said first arrangement of pads to said n pads of said second arrangement of pads.

In another aspect, the invention is a method of forming a wiring structure for integrated circuit elements, comprising the steps of:

(a) providing integrated circuit elements;

(b) testing said integrated circuit elements;

(c) providing tailorable wiring; and (d) tailoring said tailorable wiring to provide connections among said circuit elements in view of said testing.

In another aspect, the invention is a method of forming a wiring structure for integrated circuit elements, comprising the steps of:

(a) providing integrated circuit elements;

(b) providing a layer of resist on said circuit elements;

(c) providing a first exposure to said layer of resist to provide an incomplete pattern for a wiring level; and (d) providing a plurality of exposures to said layer of resist, said exposures for adding shapes to said incomplete pattern to complete said pattern and provide tailored connections among said circuit elements.

BRIEF DESCRIPTION OF THE DRAWINGS

The foregoing and other objects, features, and advantages of the invention will be apparent from the following detailed description of the invention, as illustrated in the accompanying drawings, in which:

FIG. 1a is a planar view of the side face of a bread loaf stack of chips having good chips, defective chips, and spare chips.

FIG. 1a' is a planar view of the side face of the stack of FIG. 1 a after repair by a method of the present invention.

FIG. 1c' is a planar view of the side face of a stack of chips having a first level of metallization on the side face, the first level of wiring comprising T-connect pads.

FIG. 7 is a table showing show the reticle of FIG. 6 is used to provide sequential exposures of the photoresist to form the individual contacts of FIGS. 4a–4c.

FIG. 10 is a table showing show the reticle of FIG. 9 is used to provide sequential exposures of the photoresist to form the individual contacts of FIGS. 8a–8c.

DETAILED DESCRIPTION OF THE INVENTION

The present invention is a structure and process for altering the configuration of an electronic structure by providing a tailorable metallization level between a first set of pads connected to internal circuits of the electronic structure and second set of pads for external connection. The second set of pads is kept invariant to facilitate external connection to the electronic structure.

The reconfiguration scheme of the present invention provides, in one embodiment, for sparing a stacked arrangement of chips. FIG. 1a illustrates an edge view of stack 16 that includes integrated circuit chips 18–24 and spare chips S1 and S2. The invention provides a way to disconnect defective chips 22 and 23 from stack 16 and to connect spare chips S1 and S2, so that, from the point of view of external circuitry, there is no change in the connection to the stack or function of the stack as shown in FIG. 1a'. In another embodiment, the invention also provides for changing the logical arrangement of circuits within an electronic component, such as the organization of memory I/O on a memory chip. In either embodiment chips or circuits are tested. Defective chips or circuits are identified at the test step. The reconfiguration scheme can also take into account other parameters found during testing, such as current, that is not necessarily caused by a defect, and provide an architecture that takes advantage of that knowledge.

Figure 1B:
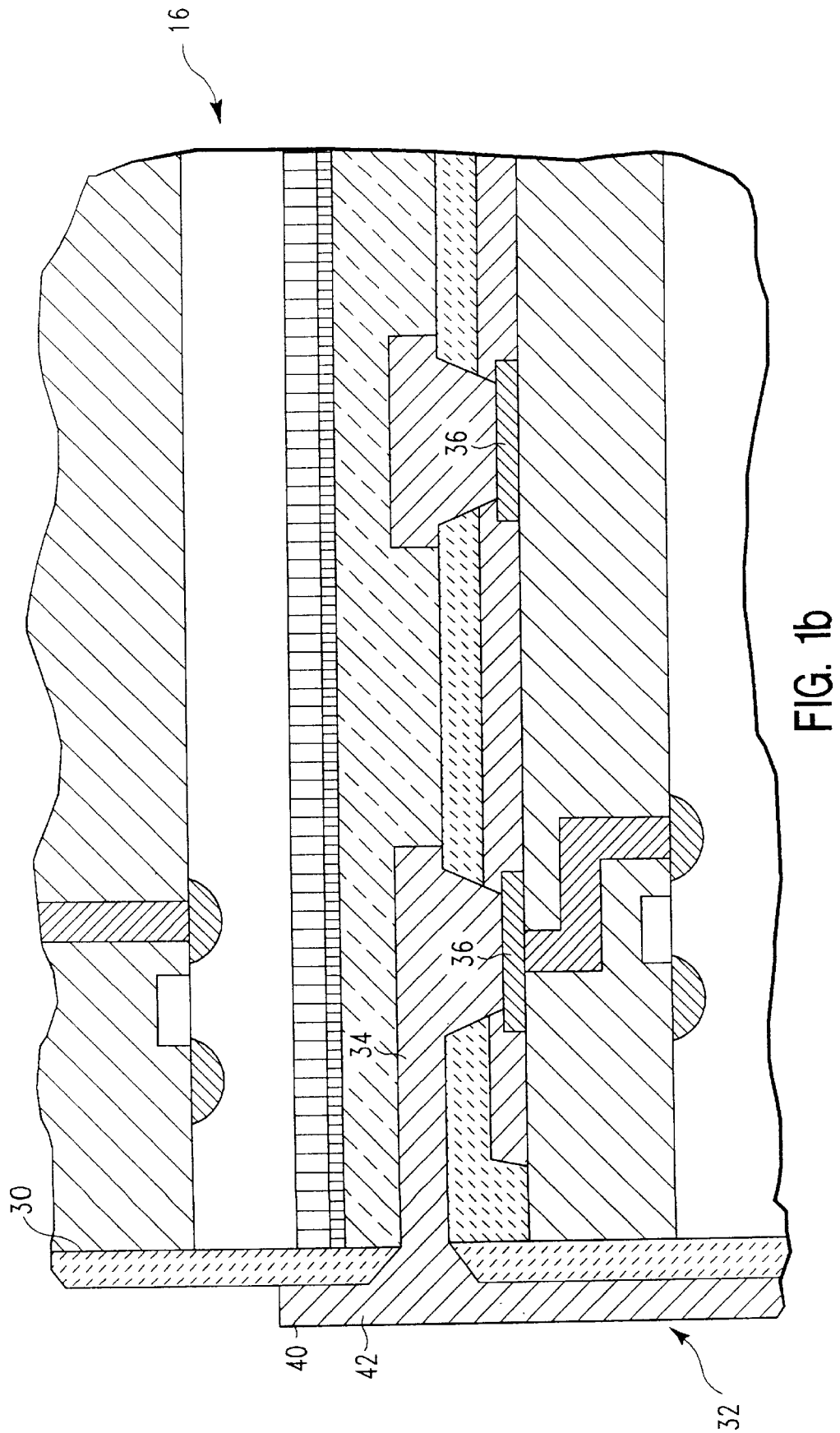
FIG. 1b is a cross sectional view of a stack of chips showing the chip edges forming a cube side face, transfer wiring connecting chip pads with the side face, and a first level of metallization on the side face contacting the transfer wiring.
Figure 1C:
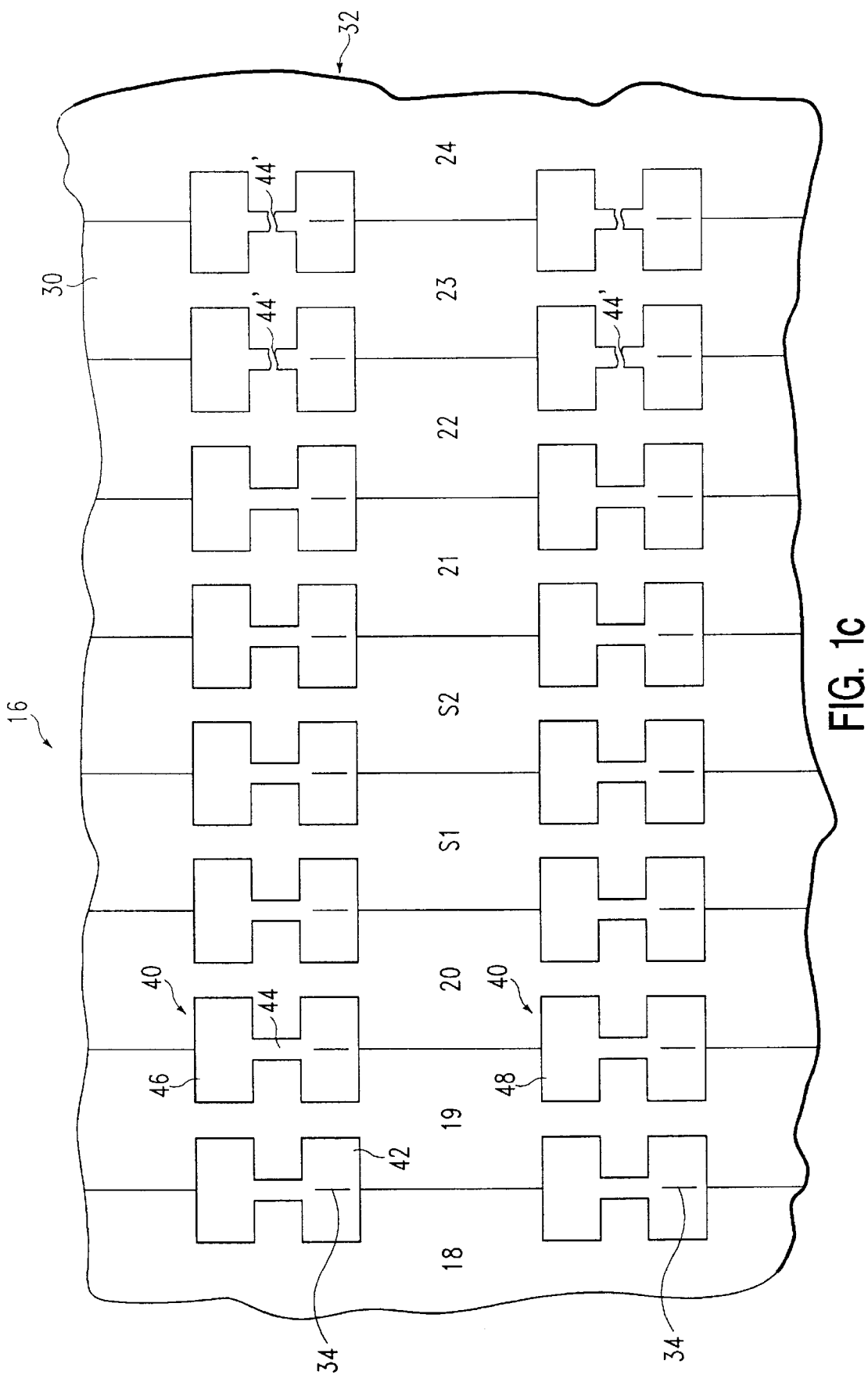
FIG. 1c is a planar view of the side face of a stack of chips having a first level of metallization on the side face, the first level of wiring comprising T-connect pads connected to contact pads through fuses.
Figure 1C:
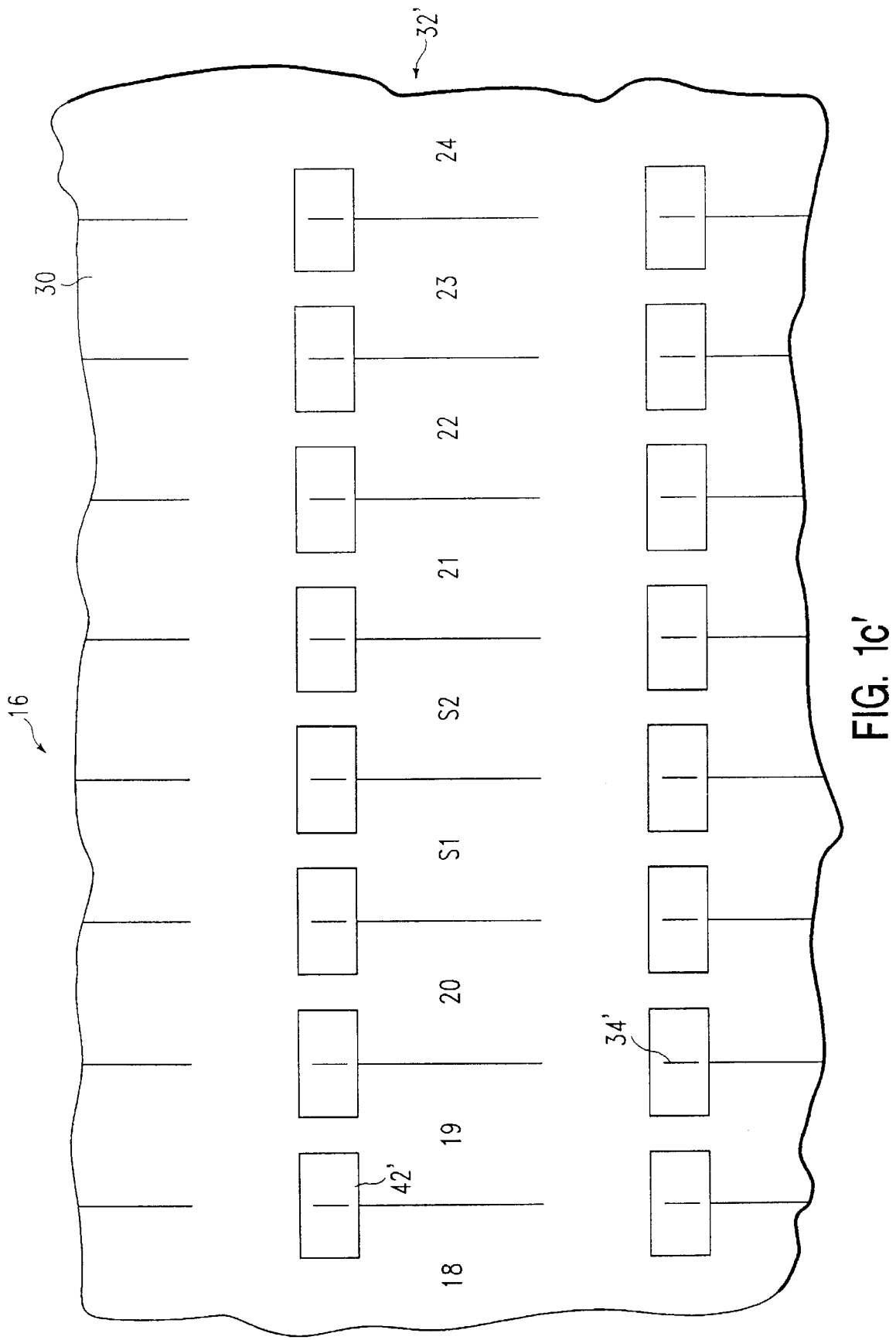

As shown in more detail in FIGS. 1b–1c, each chip edge 30 forming side face 32 of stack 16 includes transfer metal wire 34 extending over the planar surface of each chip from chip pad 36 to chip edge 30. First side surface metallization layer 40, including T connect pads 42, is applied to side face 32 contacting transfer metal wire 34 as described in U.S. Pat. No. 5,478,781 to Bertin et al, incorporated herein by reference. First side surface metallization layer 40 also includes fusible link 44 and pad extension 46 or 48 for external connection to stack 16. Two transfer wires and two pads for each chip are shown in FIG. 1c, but each chip can have many more interconnect pads. As will be seen in more detail under the discussion of FIG. 1d, pad extensions 46 are for bussed interconnection among all chips of stack 16 whereas pad extensions 48 provide individual connection to each chip in stack 16. In the illustration of FIG. 1c, chips 22 and 23 are defective, and fusible links 44 to those two chips have been opened (providing open fuses 44). Thus, chips 22 and 23 are electrically disconnected from stack 16.

FIG. 1c' is shown without fusible links. This is because some second tailorable metallization layer options (described herein below) require first metal layer disconnect of shorted (or high leakage) terminals as shown in FIG. 1c, and some do not, as shown in FIG. 1c'.

Figure 1D:
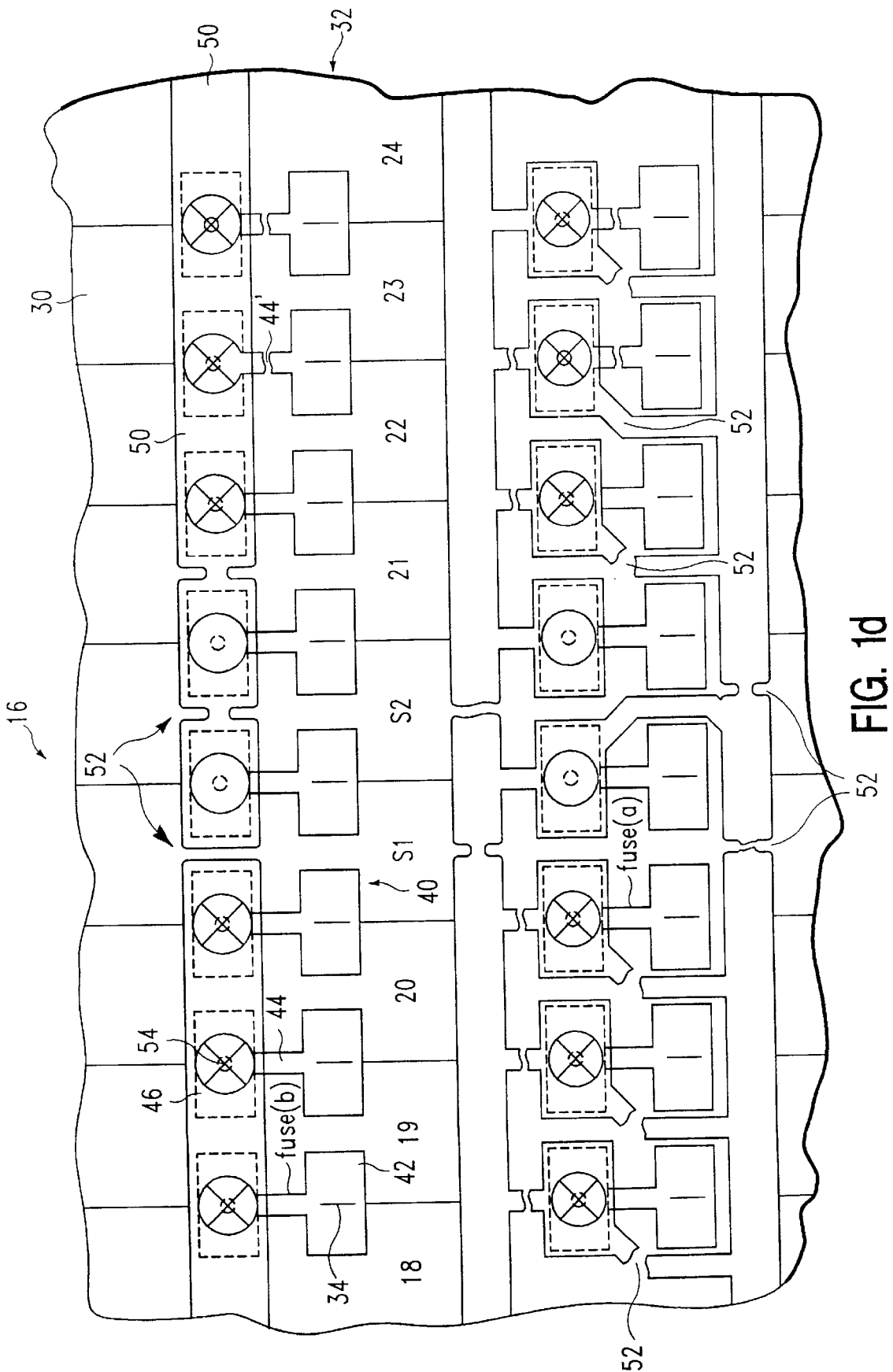
FIG. 1d is a planar view of the side face of a stack of chips of FIG. 1c having a second level of metallization on the first level of metal, the second level having fuses and patterned to provide the spare chips in the place of the defective chips.

In the next step, shown in FIG. 1d, second tailorable metallization layer 50 is photolithographically defined and applied to side face 32. Second metallization layer 50 provides bussed connection among pad extensions 46 and individual connections to pad extensions 48. Second metallization layer 50 also includes fusible links 52 for connecting spare chips S1 and S2 to extensions of chips 22 and 23, respectively. Finally, interconnects, such as solder bumps 54, are provided on second tailorable metallization level 50 on pad extensions 46, 48, as also shown in FIG. 1d. By following the interconnection path of metallization layer 50 through appropriately closed or opened fusible links 52 in FIG. 1d one can see how chips S1 and S2 replace disconnected chips 22 and 23, providing both bussed connections and individual connections on stack 16. From the point of view of circuitry external to stack 16, solder bumps 54 that contact pad extensions 46, 48 of defective chips 22 and 23, are actually disconnected from chips 22 and 23 (because of opened fusible links 44) and connected to spares S1 and S2 (through second metallization level 50).

Figure 2A:
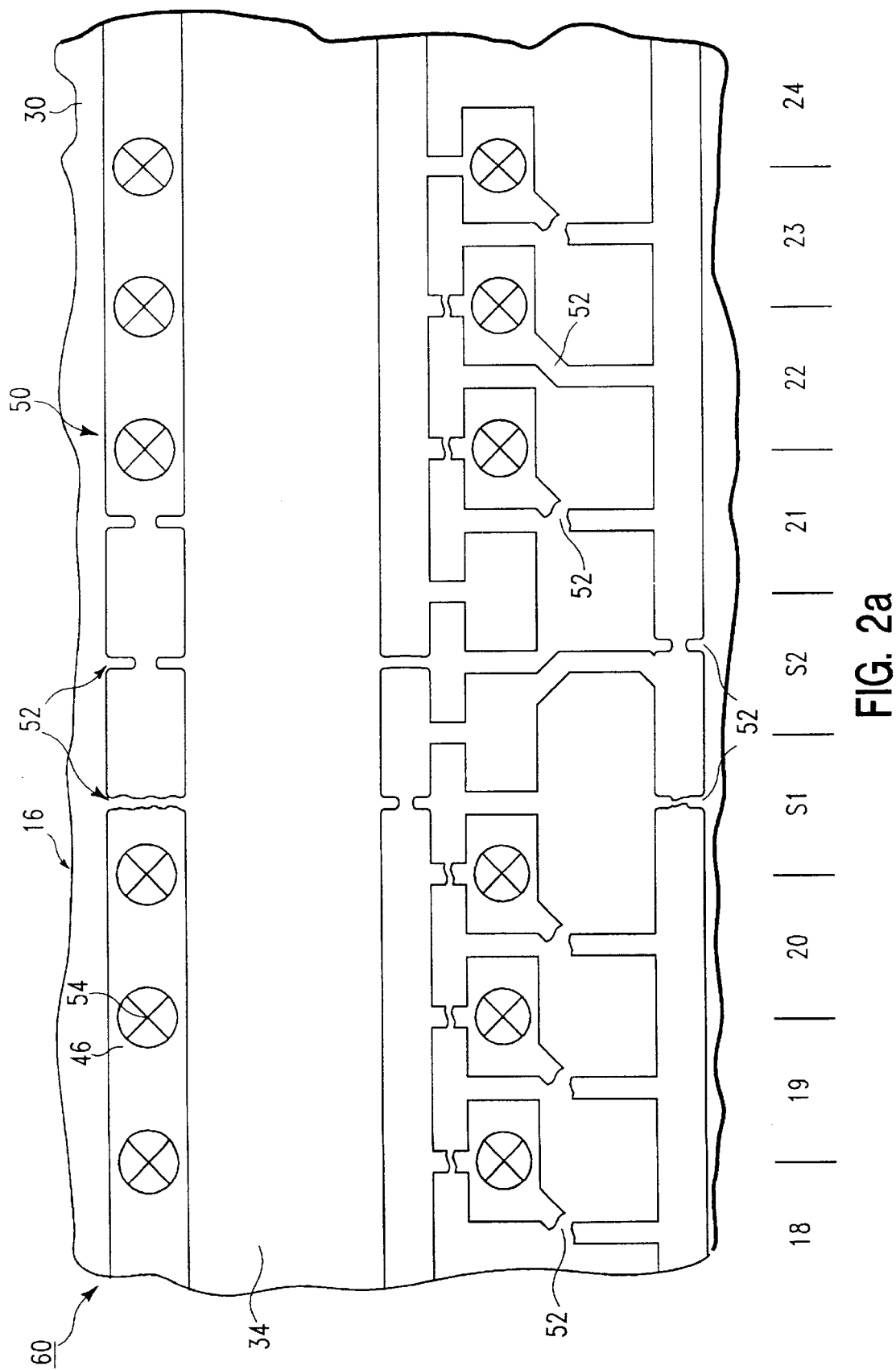
FIG. 2a is a planar view of the stack of chips of FIG. 1a having the second level of metallization on an interposer for connection to the side face of the stack.

The first embodiment of the invention, illustrated in FIG. 1d has second tailorable metallization level 50 integrated on first metallization level 40. In a second embodiment, the same interconnect scheme is achieved by providing tailorable metallization level 50 on interposer 60 as shown in FIG. 2a. Attaching interposer 60 with metallization layer 50 to metallization level 40 (FIG. 1c) provides the identical electrical connection as the scheme of FIG. 1d, but now two levels of metallization 40, 50 can be separately manufactured. By decoupling tailorable metallization level 50 from side face 32, processing cost is reduced and yield is enhanced. In addition, photoprocessing problems associated with processing small sized structures, such as edge bead that might form along chip stack edges, are minimized.

Figure 2B:
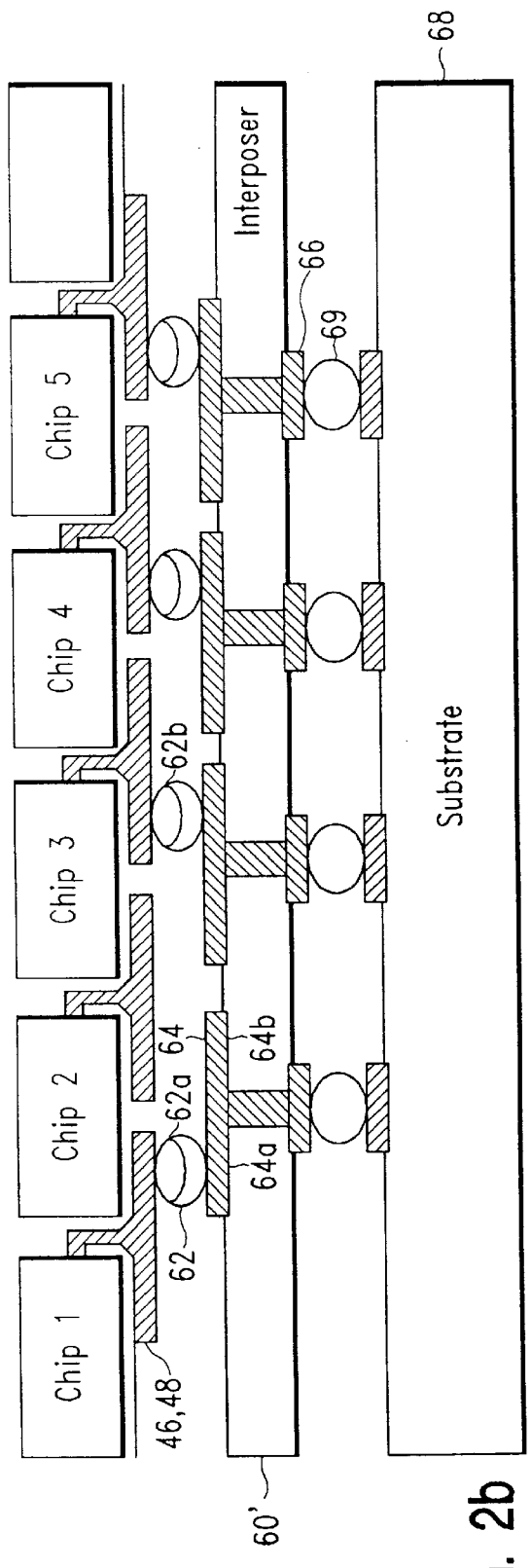
FIG. 2b is a cross sectional view of the stack of chips of FIG. 1a having the second level of metallization on an alternate embodiment of the interposer.

The interposer embodiment of the invention shown in FIG. 2a also permits additional flexibility in interconnecting personalization levels 40 and 50. In addition to providing for separate personalization of metallization levels 40 and 50 on separate structures, the use of interposer 60 permits control over the interconnect between levels 40 and level 50. Selective interconnection can be used to perform the function of opened and closed fuses 52 of FIGS. 1d and 2a. As shown in FIG. 2b, pad extensions 46, 48 are connected through bump connectors 62 to pads 64 on interposer 60'. Each bump connector 62 contacting interposer 60' can be located in either of two positions 64a, 64b on pad 64 to enable contact of pad 64 to either of two adjacent chips. Thus, bump connector 62a located in position 64a contacts chip 1 rather than chip 2 whereas bump connector 62b located in position 64b contacts chip 3 rather than chip 2. Straight connections through interposer 60' to substrate-connect pads 66 can now be provided, the winding path of metallization 50 through open and closed fuses 52 of FIGS. 1d and 2a being no longer needed.

Using the placement of bump 62 as a selection means, it is possible to bypass connection to a chip pad. Accordingly, FIG. 1c' may be used instead of FIG. 1c, with face 32' not requiring fuse 44, 44' shown in FIG. 1c.

Interposer 60' is itself connected to substrate 68 through bump connectors 69. Bump connectors 62 and 69 are formed using connector techniques, such as C4 solder bumps, solder paste, conductive paste, or gold bumps, all well known in the art. Gold bumps are most conveniently provided on interposer pad 64 using conventional gold bump technology in which a wire bonder is programmed to locate the gold bump where desired based on chip pass-fail data. Conductive paste is advantageous since it is reworkable. A bump encapsulant material such as a high temperature filled epoxy (for example, Dexter Hysol 4526 encapsulant or Locktite 3510) is used under interposer to reduce stress from thermal expansion mismatch. A ground plane, or a power plane, or a split ground and power plane, or separate ground and power planes may be included in interposer 60' for enhanced electrical performance (e.g., reduced inductance, decoupling capacitor options, etc.).

Figure 2C:
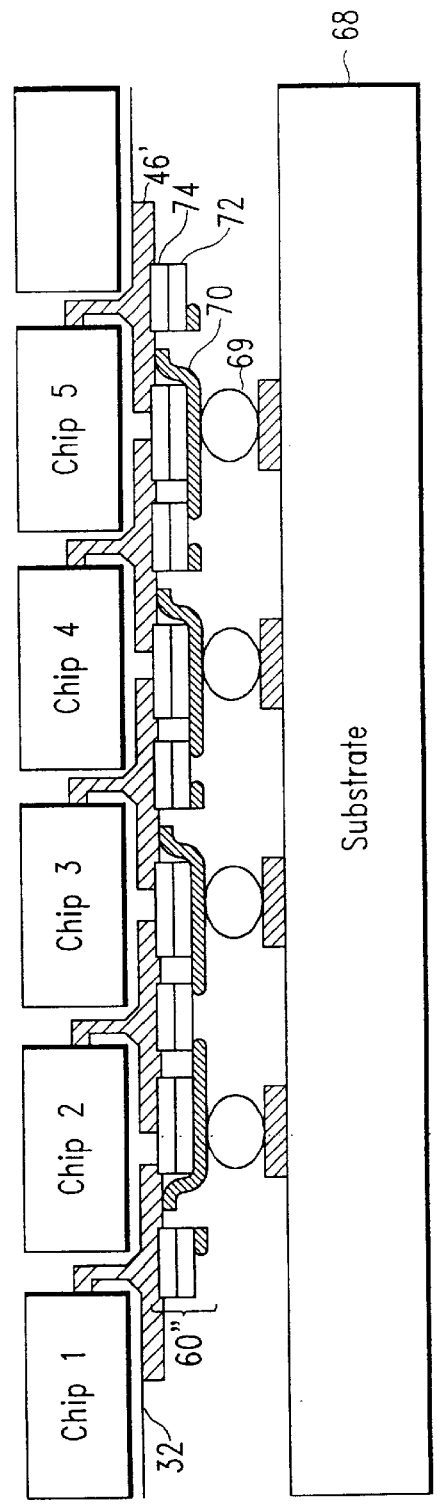
FIG. 2c is a cross sectional view of the stack of chips of FIG. 1a having the second level of metallization on a third embodiment of the interposer.

In addition to bump placement variation, selective connection between metallization on interposer 60 and level 40 on side face 32 of stack 16 can also be accomplished using flex-type interposer 60" having ribbon bonds 70, as shown in FIG. 2c. Ribbon bonds 70 accomplish the function of the metallization level 50 and fuses 52 of FIGS. 1c, 2a or of the variable location bump connectors 62 of FIG. 2b, by selectively making connection where needed. By contrast, in FIG. 2a, connection was selectively deleted with fuses and in FIG. 2b connection was provided by selectively locating the entire bump connector. Interposer 60" of FIG. 2c has ribbon bond 70 supported on tape 72 having adhesive 74 for secure fastening to side face 32. In this embodiment, ribbon bonds 70 eliminate the need either for fuses (FIG. 2a) or selective bumps (FIG. 2b). Thermal expansion mismatch stress between side face 32 and interposer 60" is accommodated through the use of a low modulus, silicon-based adhesive (e.g., Dow Corning 7910 Chip Scale Encapsulant). The interposer 60" is selected to have a coefficient thermal expansion (CTE) similar to that of the next level of assembly (e.g., CTE in the range of 10–20 ppm/° C.) while the chip has a CTE of approximately 3 ppm/° C. Additionally, the ribbon bonds provide a highly reliable, compliant electrical interconnection between side face 32 and interposer 60" for enhanced electrical performance (e.g., reduced inductance, decoupling capacitor options, etc.).

Figure 3:
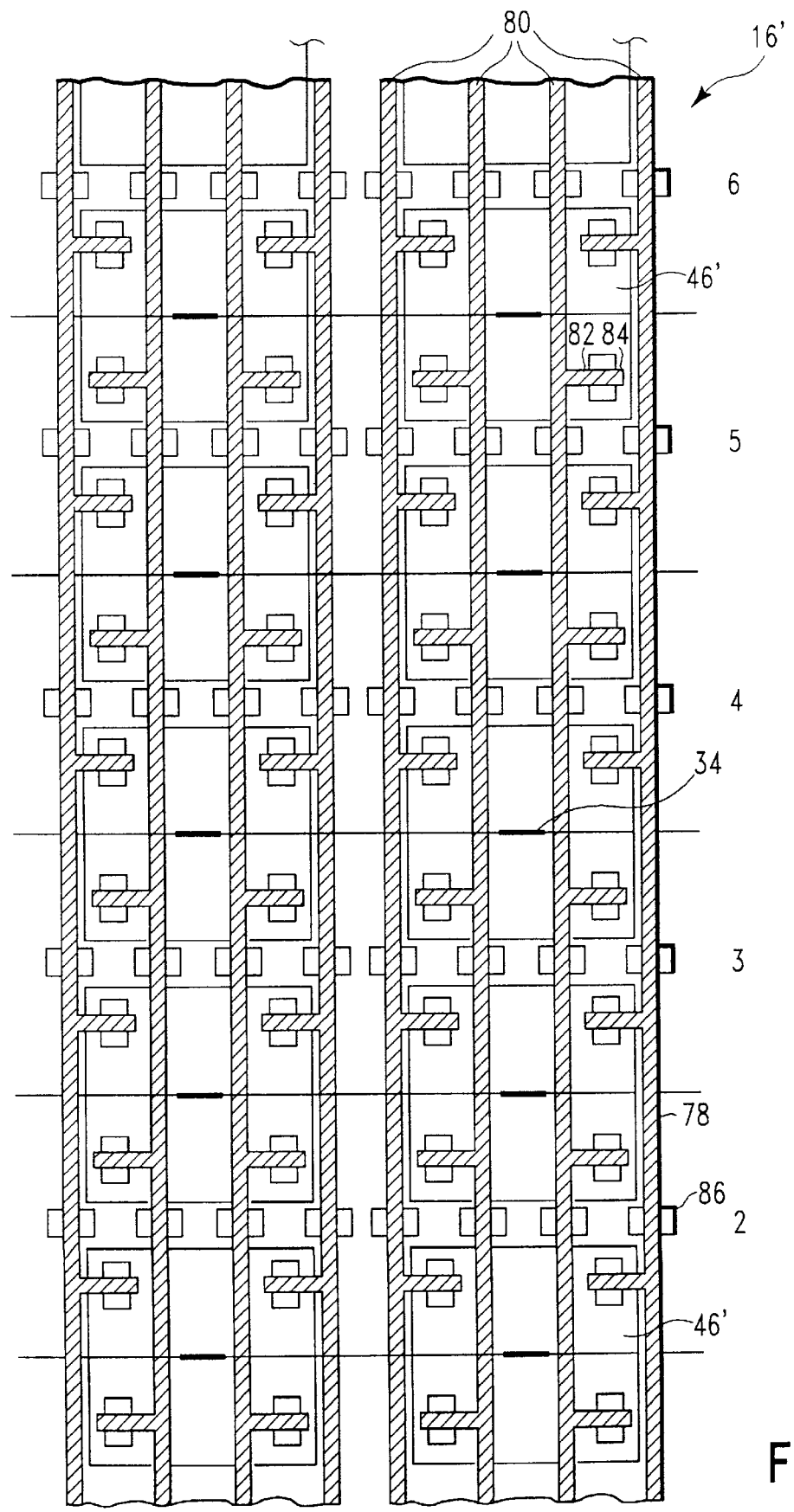
FIG. 3 is a planar sectional view of a pancake stack of chips showing the second level of metallization patterned on the side face of the stack.

While connection to stacks of chips arranged in the bread loaf structure of FIGS. 1a–1c and 2a–2c has so far been shown, the present invention is equally suitable for stacks of chips arranged in a pancake stack, as shown in FIG. 3. In this case connection to a substrate will be from an end chip of pancake stack 16'. As with bread loaf stack 16 of earlier figures, interconnect wiring extends along side face of the stack 16' to interconnect the individual chips.

A scheme for sparing to provide four good chips out of a stack having six chips is provided in FIG. 3, with the availability of two extra chips for sparing providing a very high probability of there being at least four good chips in the stack. The interposer of FIG. 2d with ribbon bonds is used for making connections to pads 46' along side face stack 16'. Four buses 80 are provided, each bus available for connection to each of the six chips of the stack to provide a way to obtain individual connection to pad 46' of each of the four desired chips. Connector lines 82, one from each bus 80, potentially link each bus to one of the pads 46', but only one connection will actually be made between one of the four buses and one chip I/O pad through ribbon connector 84 (see numeral 70 in FIG. 2c for a cross section of a ribbon connector). Thus, the four buses 80 are each connected to a different single chip in the stack.

For bused connections, such as power and ground, a single bus can be used having a connector line connecting the bus to pads 46' all four desired chips. Selection of chips or sparing is achieved for bussed connections by either providing connection or not providing connection through ribbon bond connector lines 82.

In addition to connector lines 82 between bus and each chip of the stack, each bus 80 also has in-line bonds 86 that can be closed or left open to connect or disconnect portions of bus 80. The ability to open unneeded portions of bus 80 provides a way to reduce loading on bus 80.

In another embodiment of the invention, the tailorable metallization level is provided through photolithographically defined metal patterns instead of blowing fuses or connecting bumps or ribbon bonds. In this embodiment a pattern for a second metallization is tailored from multiple sequential exposures of a layer of a photosensitive material on a side surface of a cube (or on an interposer). The sequential exposures of shapes from a library of shapes on a mask reticle is used to form the desired interconnect pattern. A single mask reticle having the library of shapes may be used, and the individual shapes are selected for each exposure in each location to accomplish the desired interconnections and disconnections. FIGS. 4a–4c and FIGS. 5a–5c illustrate the pattern of the second level of connected metallization formed in photoresist used in this embodiment of the invention for loaf stack 16 of FIG. 1a, in which spare chips S1, S2 are connected in the place of defective chips 22, 23.

Figure 4A:
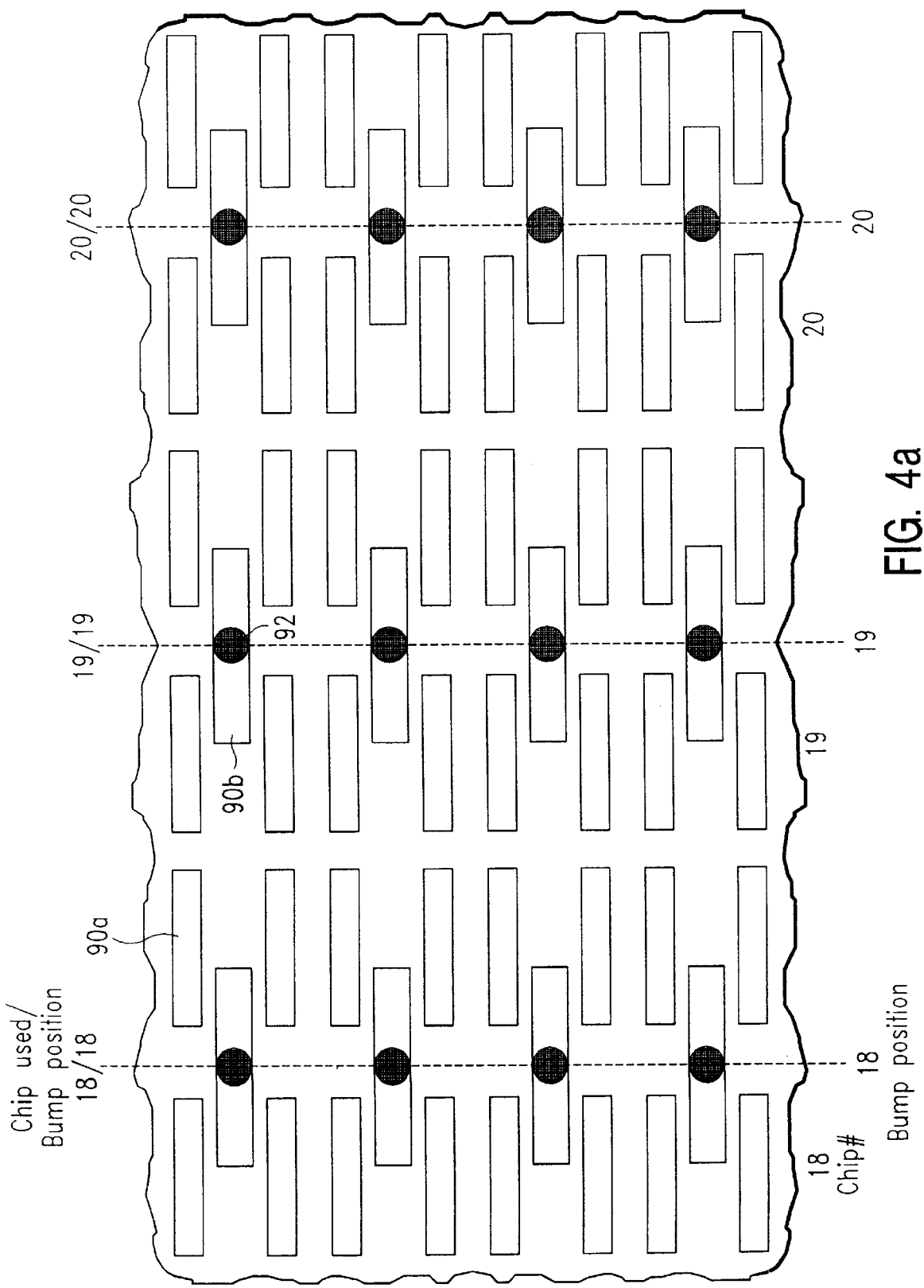
FIGS. 4a–4c are planar views of exposure windows in a first exposure of photoresist for a second level of metallization formed either on a side face of the stack or on an interposer for individual contacts to each chip of the stack.
Figure 4B:
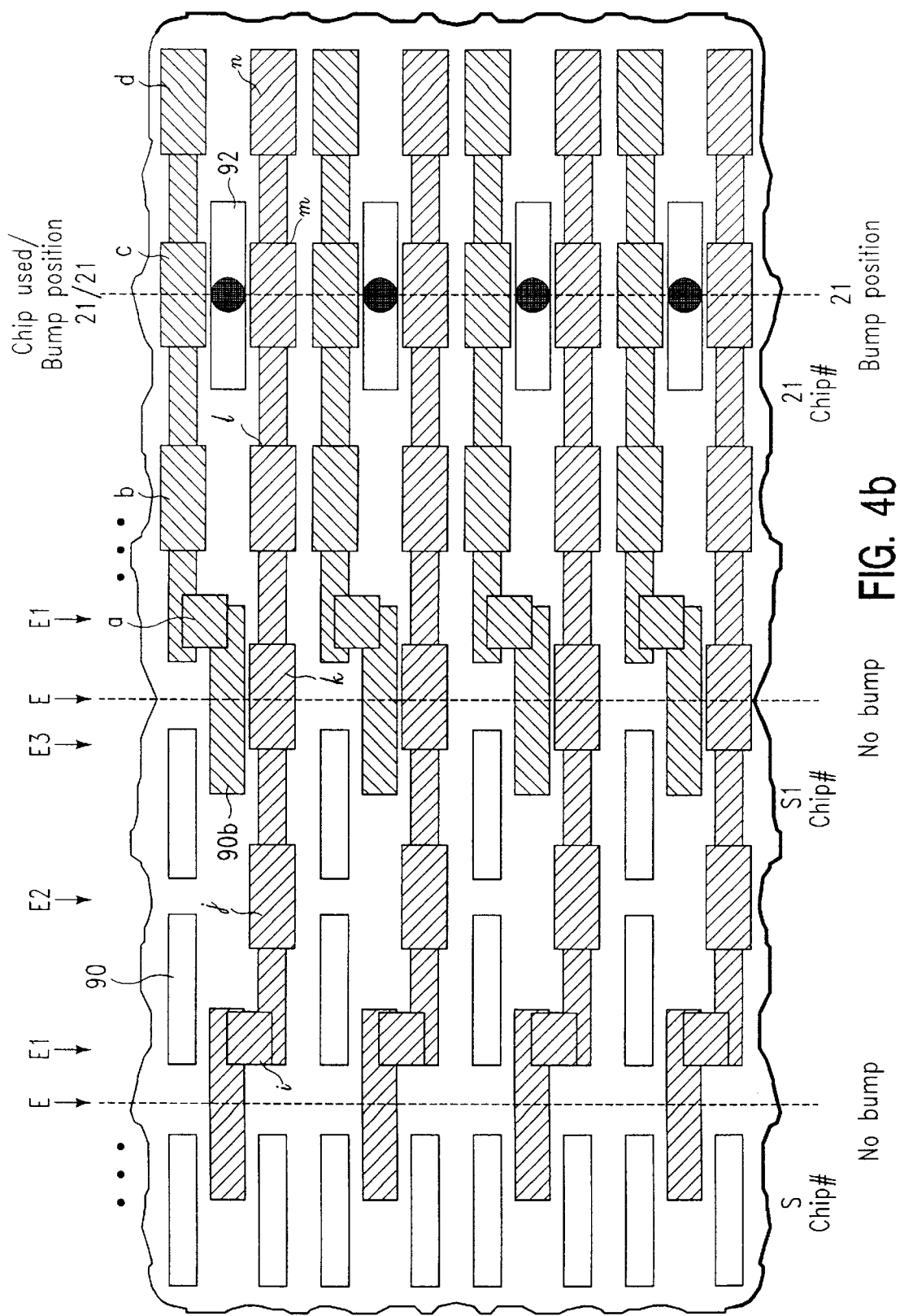
Figure 4C:
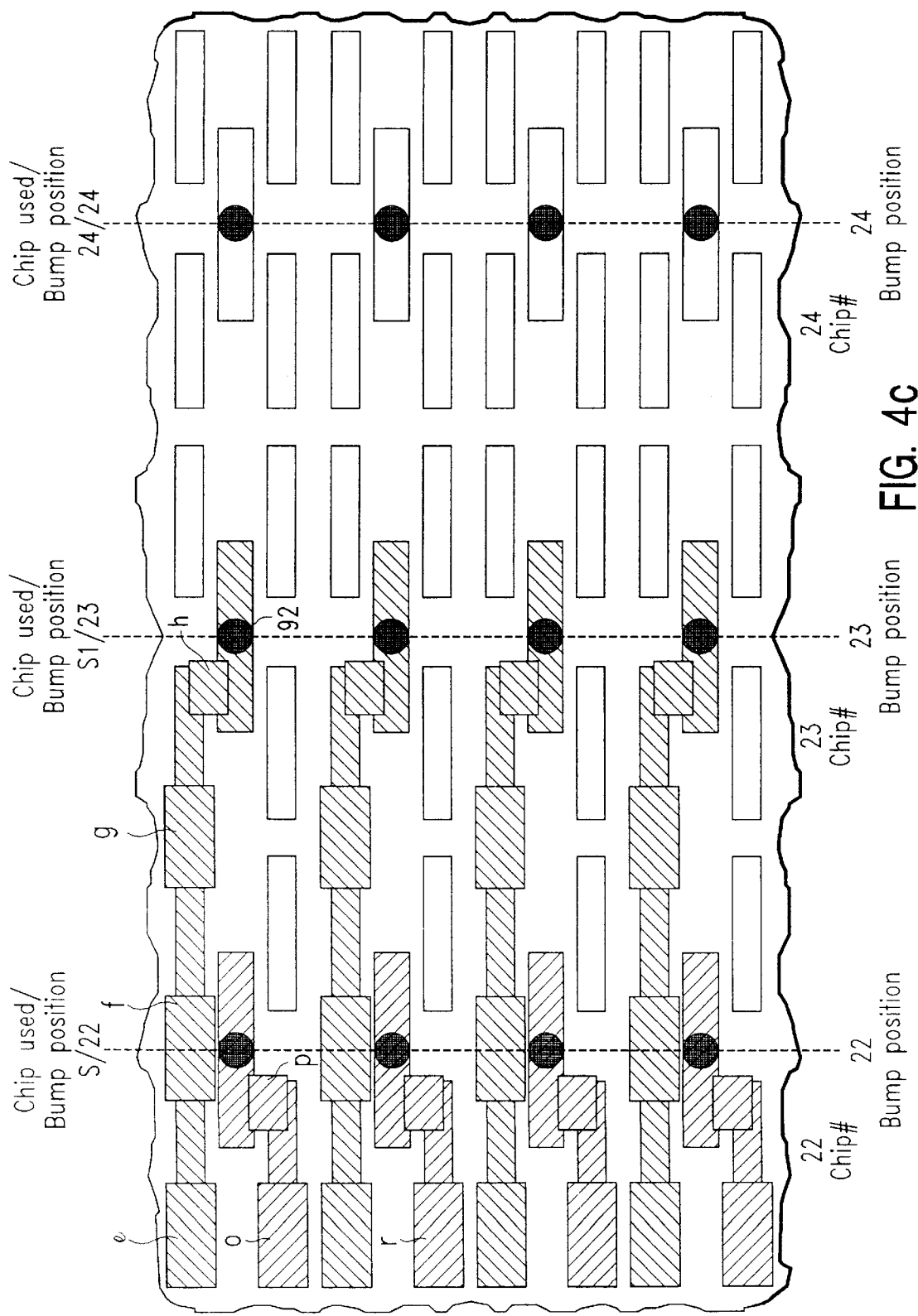

So that the details of each connection are more clearly seen stack 16 of FIG. 4 is divided into 3 sheets. Chips 18–20 are seen in FIG. 4a, chips S1, S2, and 21 are seen in FIG. 4b, and chips 22–24 are seen in FIG. 4c.

In a first exposure step, a grid of open line segments 90, is used to provide a portion of the pattern for the second metallization level. Where no interconnection is needed these segments are left disconnected as shown in FIG. 4a. Open line segments 90 are an alternative to continuous but fused metallization level 52 of FIG. 1d. Additional line segments, such as segments a–h, and i–p, are formed (FIGS. 4b–4c) by sequential exposures of the single layer of photoresist to provide a tailored pattern of open windows in the resist for the formation of a second metallization level. This tailorable pattern for the second metallization level is for connecting spare chips S1 and S2 to the locations of defective chips 22 and 23.

While bump connectors 92 (FIG. 4a–4c) are located at defective chips 22 and 23 as well as at all good chips, it is recalled that these two defective chips are disconnected from contact through fuses 44' on first metallization level 30 as shown in FIG. 1c. Bump connectors are not provided at spare chips S1 and S2 since these spare chips will be used to substitute for defective chips without any change to external connection.

Figure 5A:
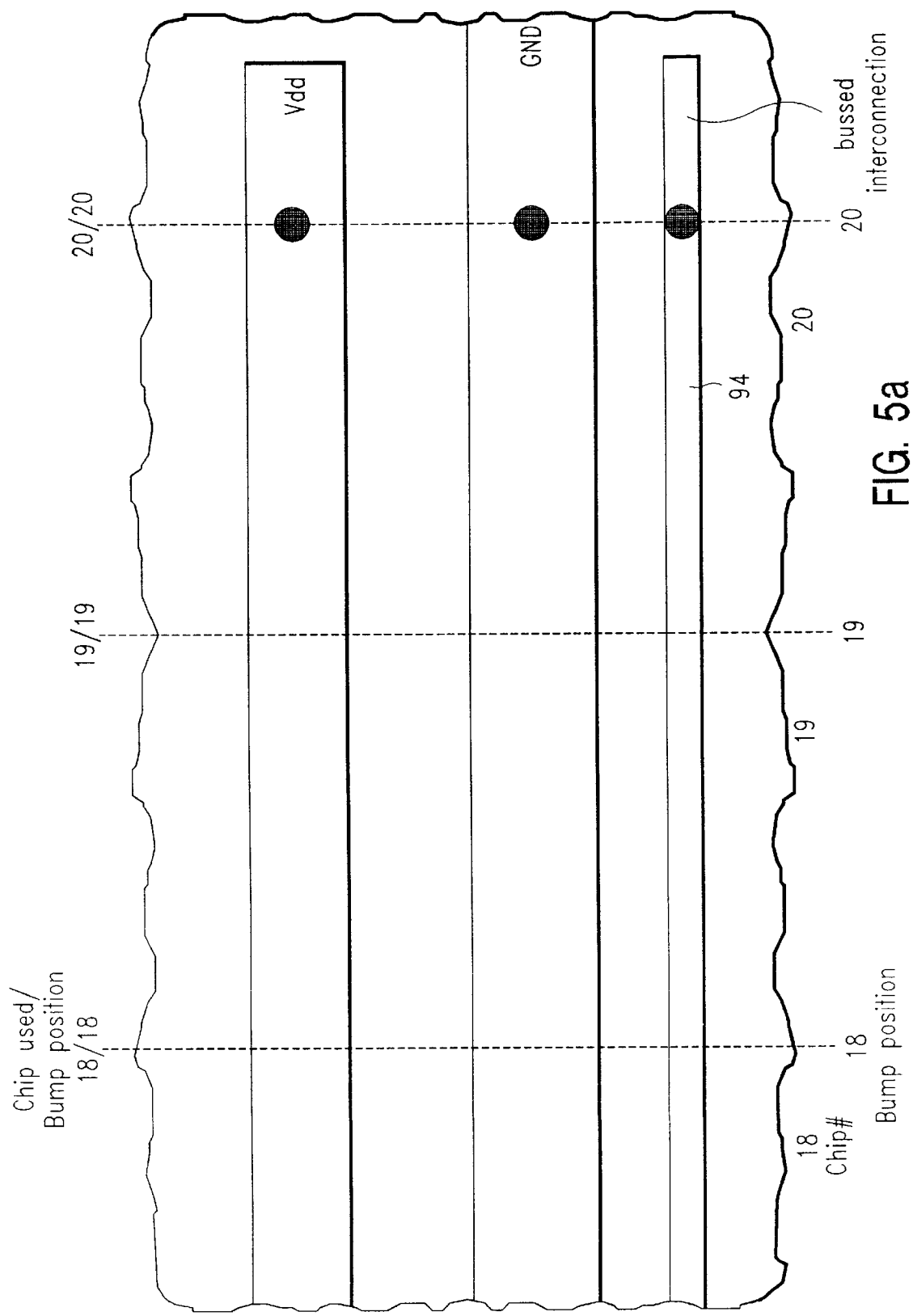
FIGS. 5a–5c are planar views of exposure windows in a first exposure of photoresist for a second level of metallization formed either on a side face of the stack or on an interposer for bused contacts to each chip of the stack.
Figure 5B:
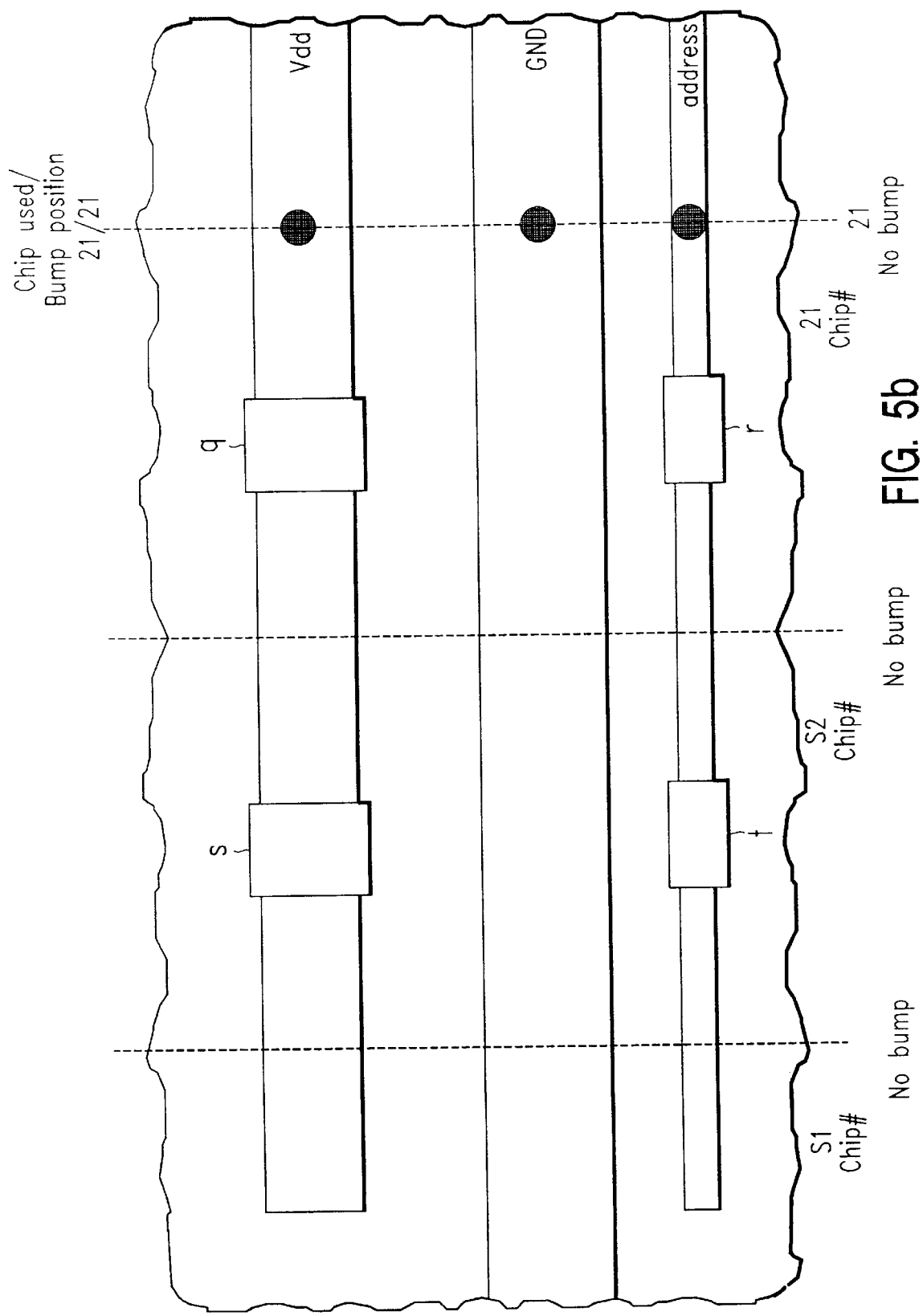
Figure 5C:
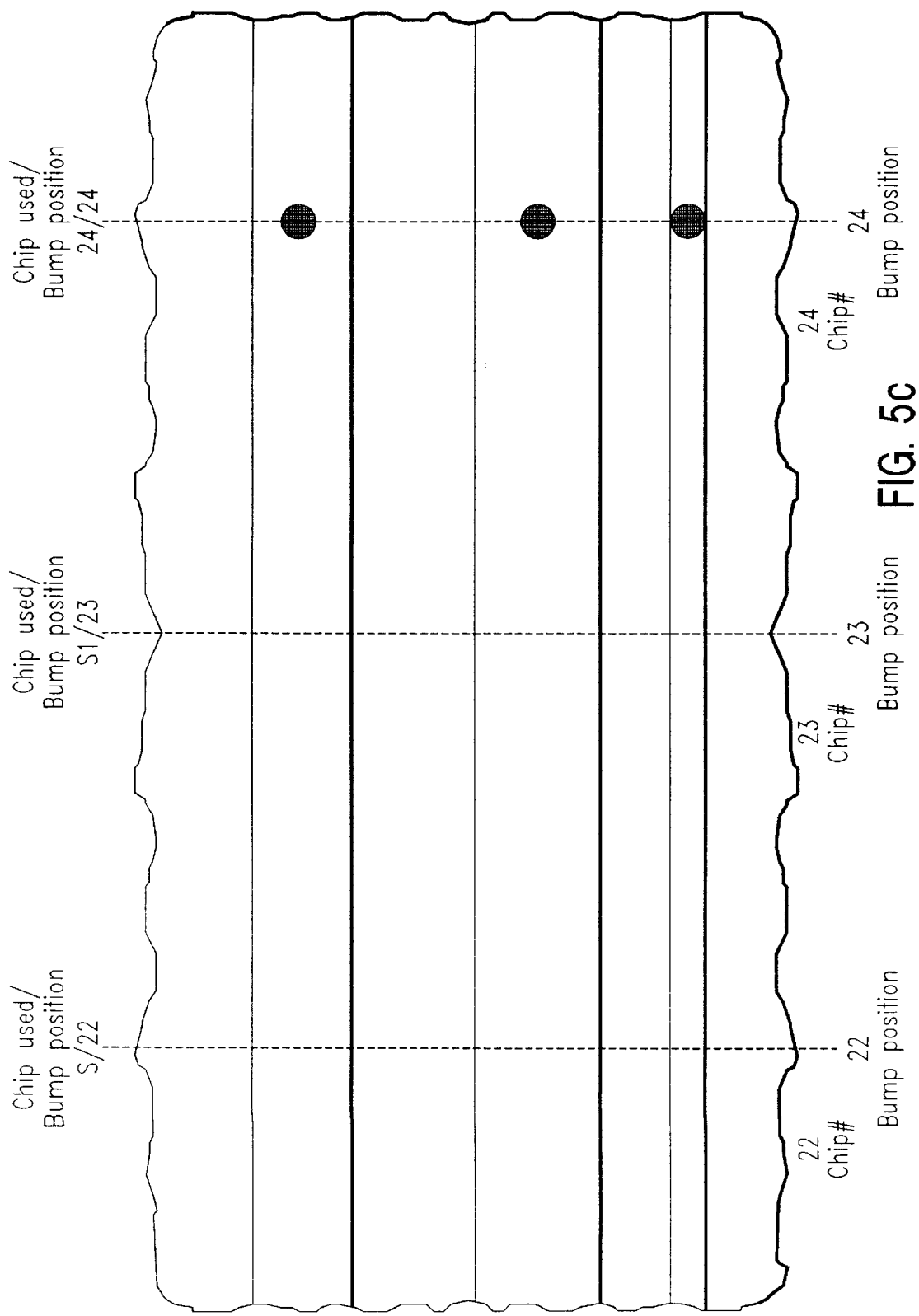

A similar scheme is shown in FIGS. 5a–5c for bused interconnections that are each provided for connection to all chips of the stack, such as for power line Vdd, ground line GND, and common input-output line 94. Each of these lines contacts pad extension 46 (see FIG. 1a) of each chip of the stack. Additional segments q, r, s, and t provide for connection of spare chips S1 and S2. If connection of spare chips S1 or S2 is not needed in a particular stack, exposure of segments q, r or s, t is not performed. Thus, one or both of these chips can be left unpowered and without common I/O connection. Preferably, ground line connection is nevertheless made to spare chips S1 and S2, as shown in FIG. 5b.

Figure 6:
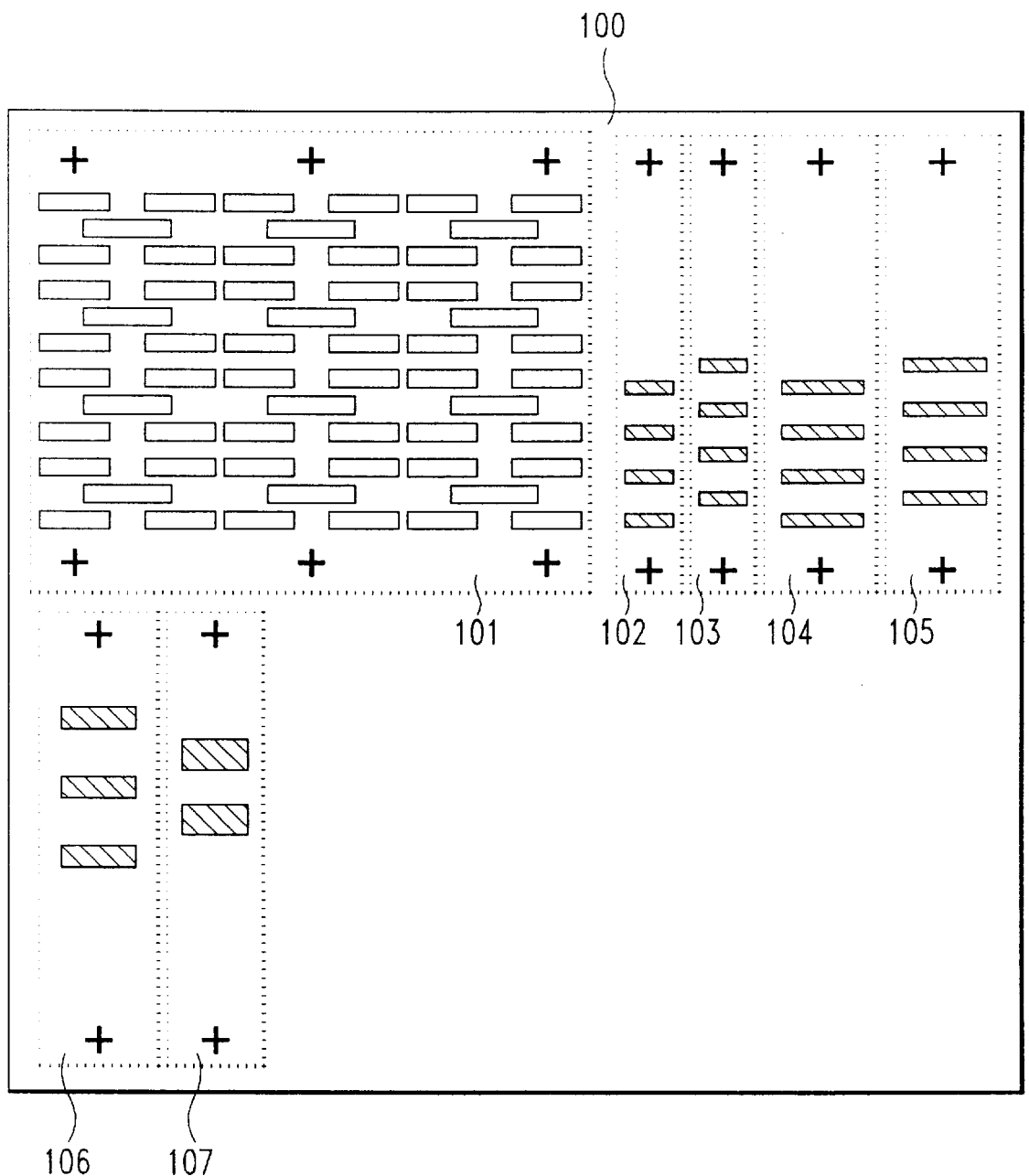
FIG. 6 is a planar view of a reticle used for sequential exposures of the photoresist to form the individual contacts of FIGS. 4a–4c.

FIG. 6 shows reticle 100 used for the interconnection scheme of FIGS. 4a–4c or 5a–5c.

Region 101 of reticle 100 is used to expose the whole cube face, to provide the segment pattern for all chips on the cube. This exposure can be performed to provide line segment 90 for all chips on the cube in one step (several exposure steps may be needed to provide this pattern for all chips on a very long cube). Regions 102 to 105 are the personalization patterns for individual I/O used for connections a–h and i–p between S1 and chip 22 and S2 and chip 23 (FIG. 4b, 4c). Regions 106 and 107 are the personalization patterns used for the bused interconnections for power supply and common I/O if connection is needed to spare chips S1 and S2.

In processing a particular cube, region 101 may be flashed to expose all chips of the cube and form segments 90. Similarly, Vdd, GND, and common I/O 94 are flashed for all chips of the stack. Then regions 101–107 are selectively flashed in the same resist to open desired portions of the resist to provide interconnections among segments 90 and VDD and common I/O connections for spare chips. FIG. 7 gives the stepping pattern for generating all connections between S1 and chip 22 and S2 and chip 23 to provide the pattern of FIGS. 4a–4c and 5a–5c. Any stepping sequence may be used. Then the resist is developed. A liftoff process is preferable but a subetch process can also be used to form the metallization pattern based on the resist pattern.

Figure 8A:
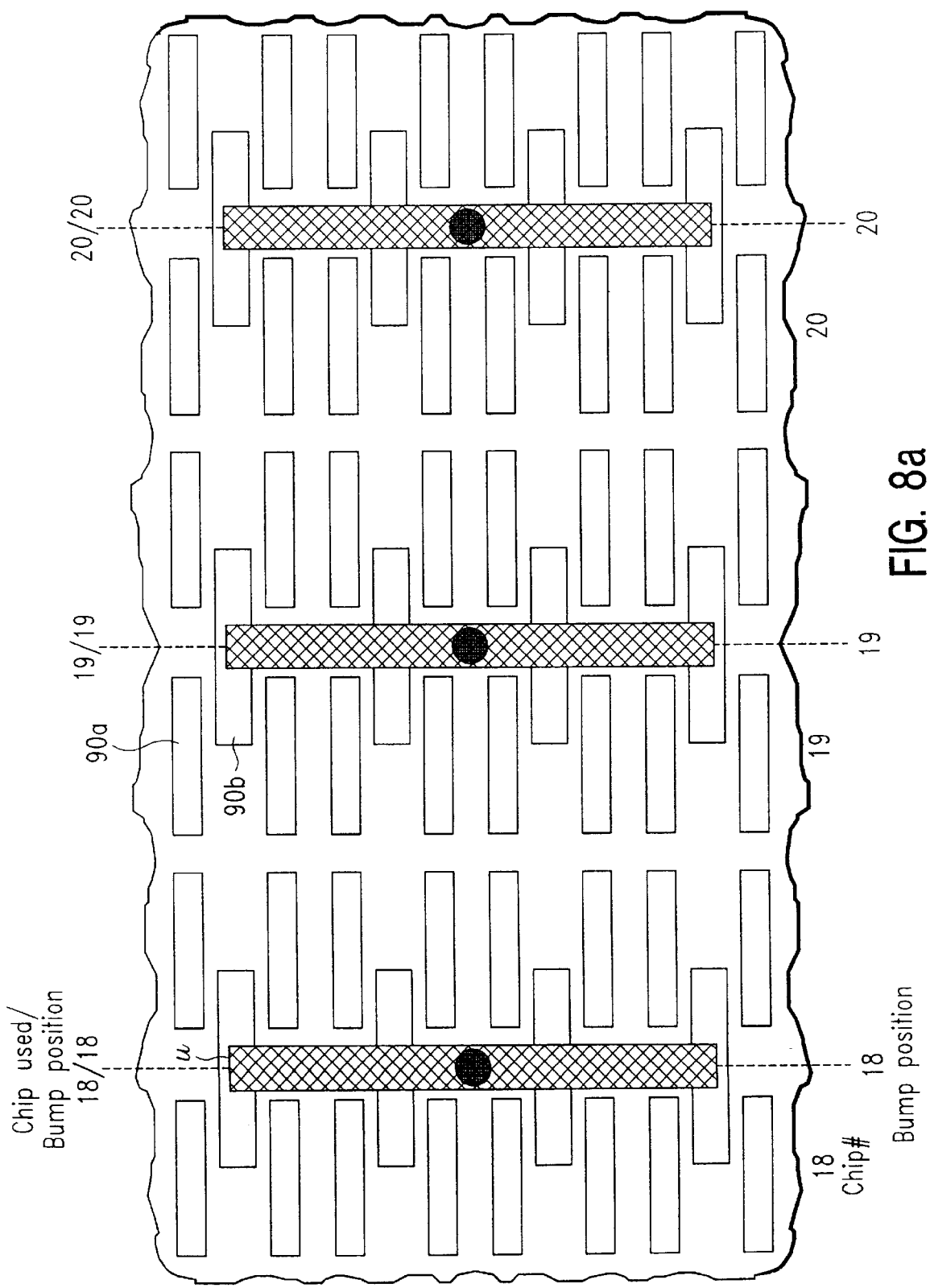
FIGS. 8a–8c are planar views of exposure windows in a first exposure of photoresist for a second level of metallization formed either on a side face of the stack or on an interposer for changing the configuration of wiring on a chip or stack of chips.
Figure 8B:
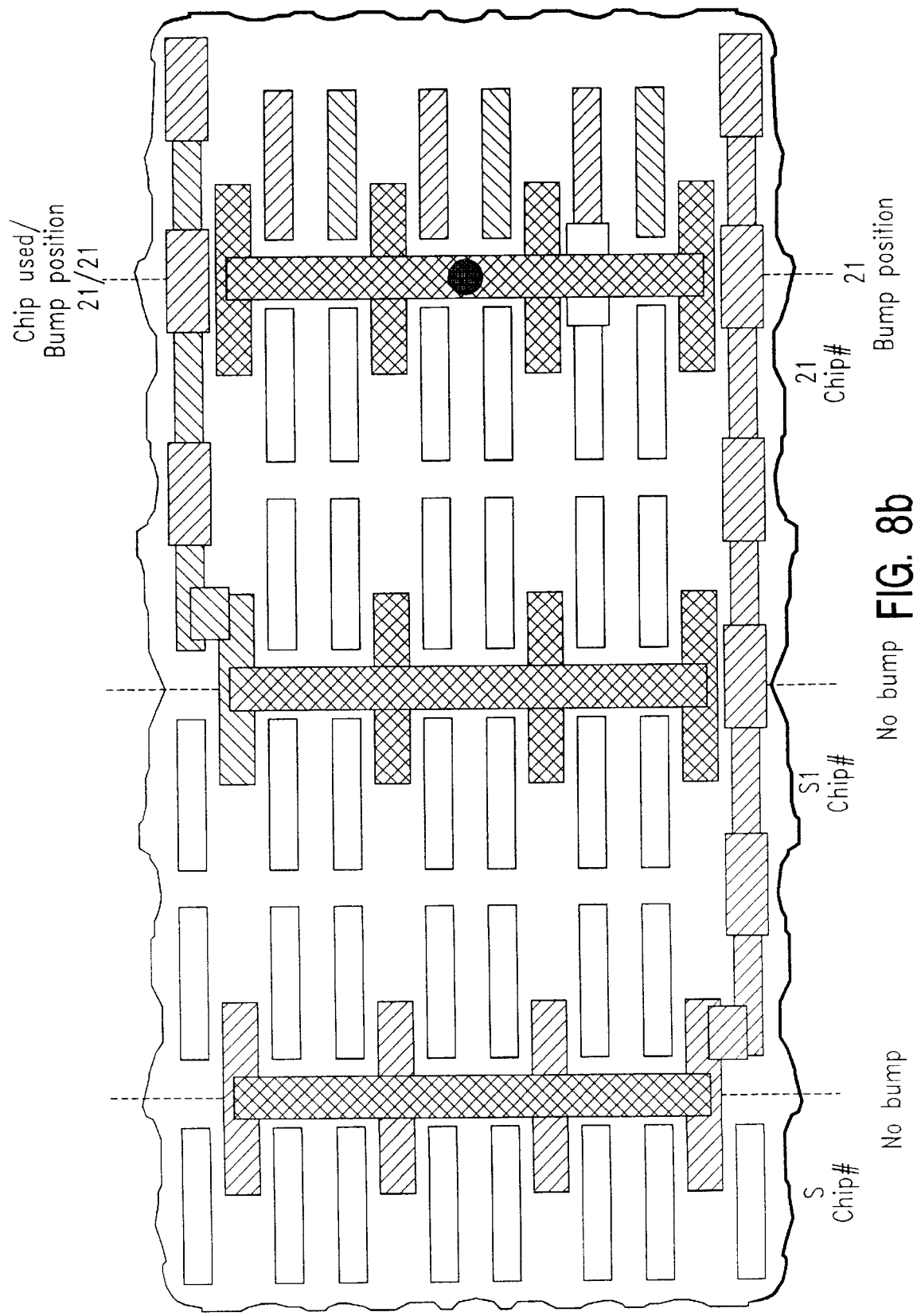
Figure 8C:
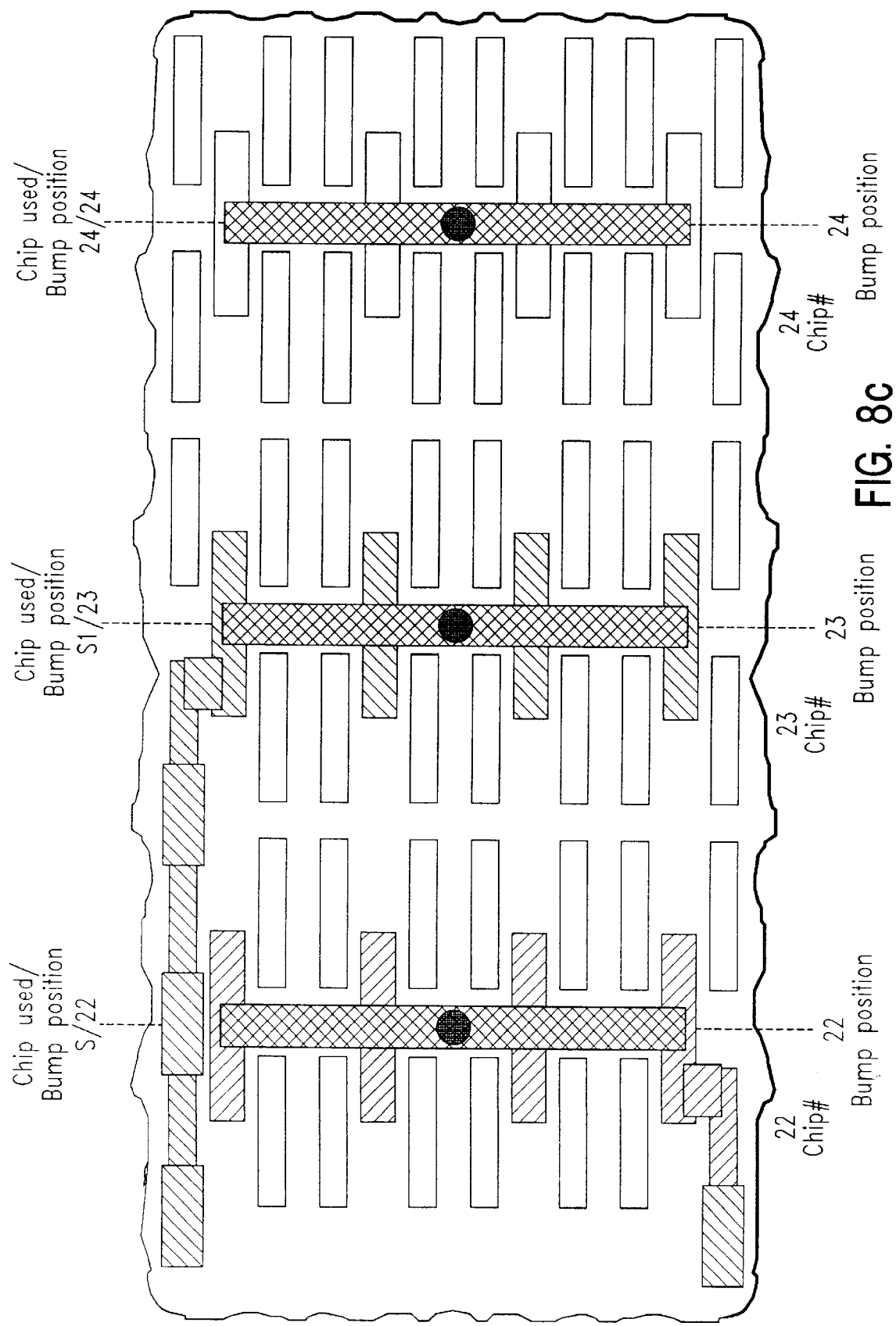
Figure 9:
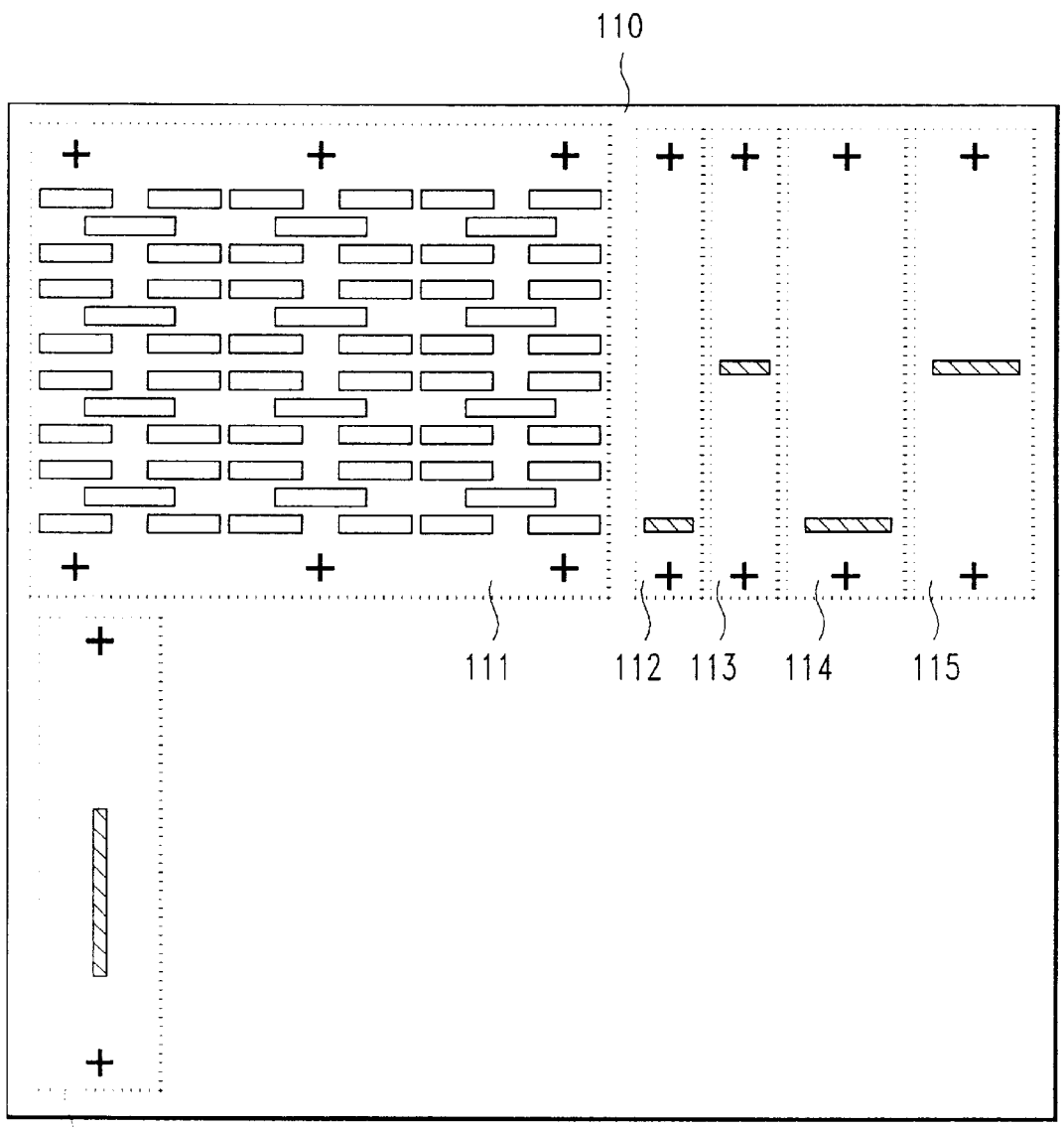
FIG. 9 is a planar view of a reticle used for sequential exposures of the photoresist to form the individual contacts of FIGS. 8a–8c.

In addition to providing for sparing a stack of chips, the present invention also permits changing the architecture of a chip or a stack of chips, as shown in FIGS. 8a–8c. Here, the architecture of a stack of chips is changed from four unique I/O to one common I/O. Line segments u interconnect the four I/O of each chip of stack 16, changing the architecture of each chip. Line segments 90a, 90b, and a–h also provide for replacing defective chips 22 and 23 with spare chips S1 and S2. Mask reticle 110 is used for this process, reticle 110 having regions 111 to 116, as illustrated in FIG. 9. It is seen that region 111 is the same as region 101 of FIG. 6. Regions 112 to 116 are changed to provide segments needed to provide a different configuration of I/O while including a means for sparing. The stepping pattern used is tabulated in FIG. 10. Thus, the architecture of chips of the cube is changed without changing anything except level 2 of the interconnection among chips. The architecture is changed without any change in any chip itself or in the first level of interconnection on the side face of the cube shown in FIG. 1a. An additional address bus is formed on side face 32 to select one of the four bused I/O, one bit at RAS time and one at CAS time.

In FIGS. 4a–4c and FIGS. 5a–5c, the bump positions on pad position such as 90b, FIG. 4a, are directly connected to the chip pad layer 32 in FIG. 1c. If the chip at the location is good, no further action is required. If not good, then the pad is connected to a good chip. The path a, b, c, d, e, f, g, and h in FIG. 4b and 4c show such a translation. Because the pad with solder bump 92 is always connected to chip pads on layer 32 (FIG. 1c), then the connection must be made to portions 46 or 48 configurations so that link 44 can be opened if the chip is not used.

Figure 11A:
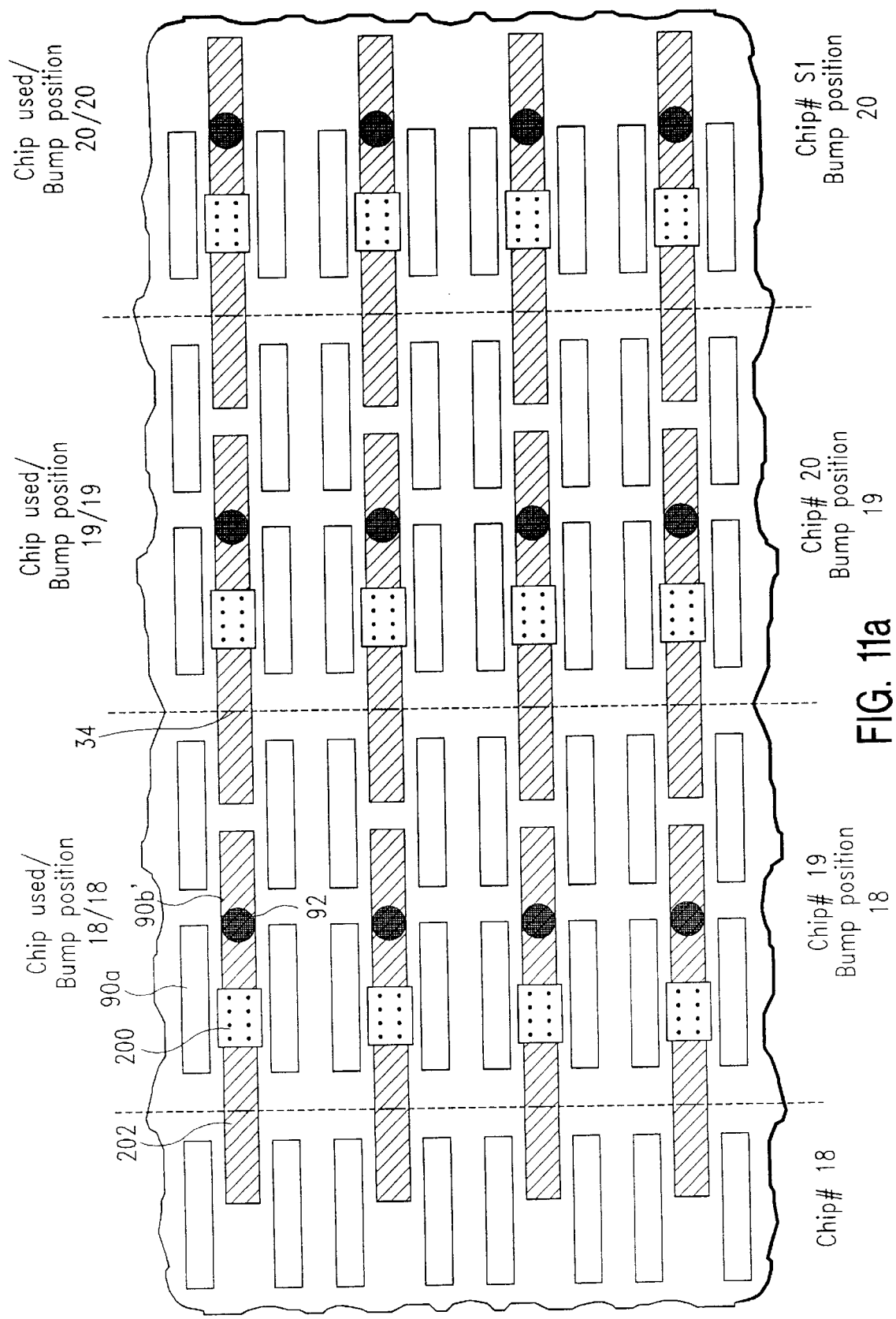
FIGS. 11a–11c are planar views of an alternate embodiment to that shown in FIGS. 4a–4c.
Figure 11B:
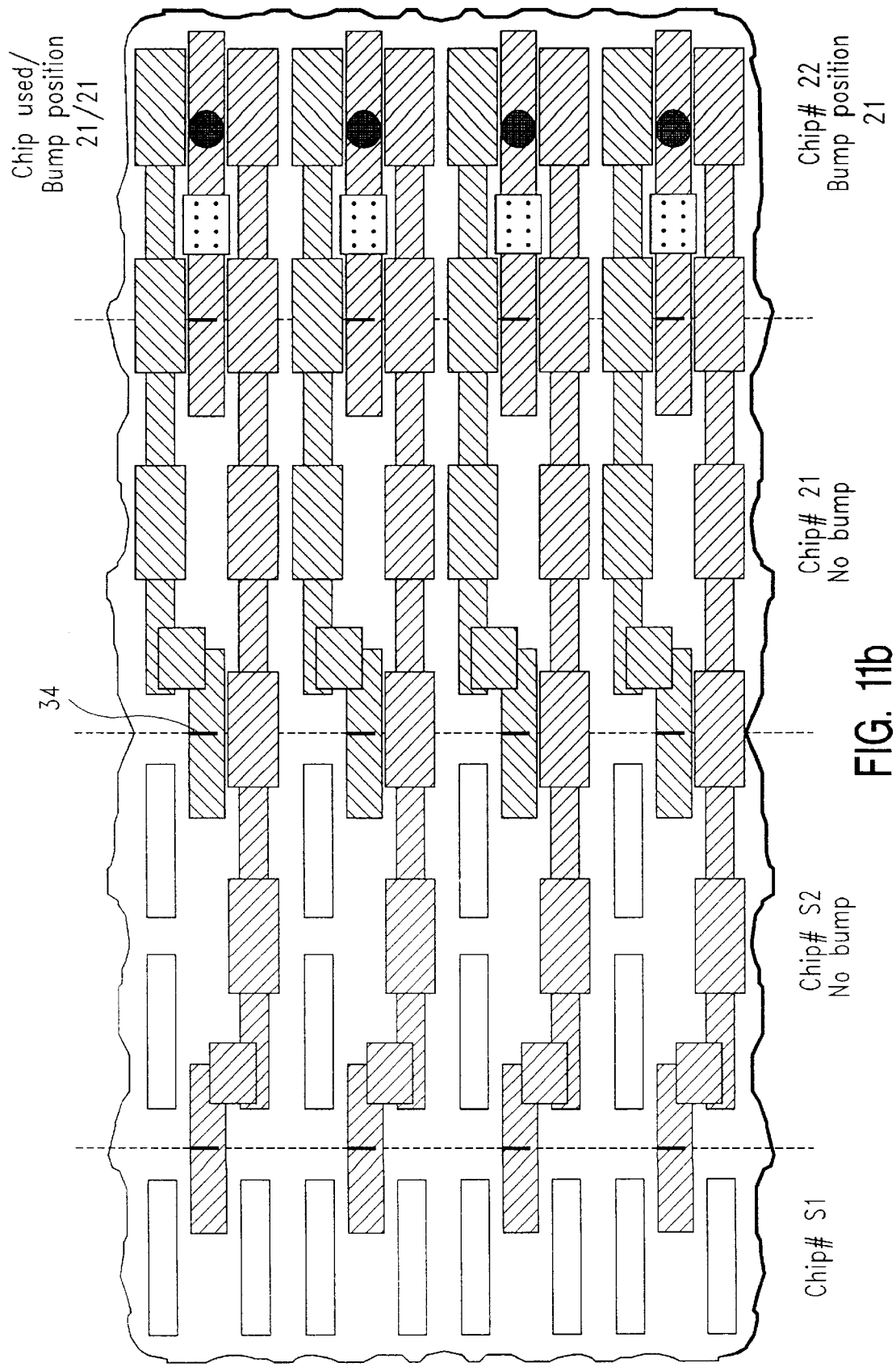
Figure 11C:
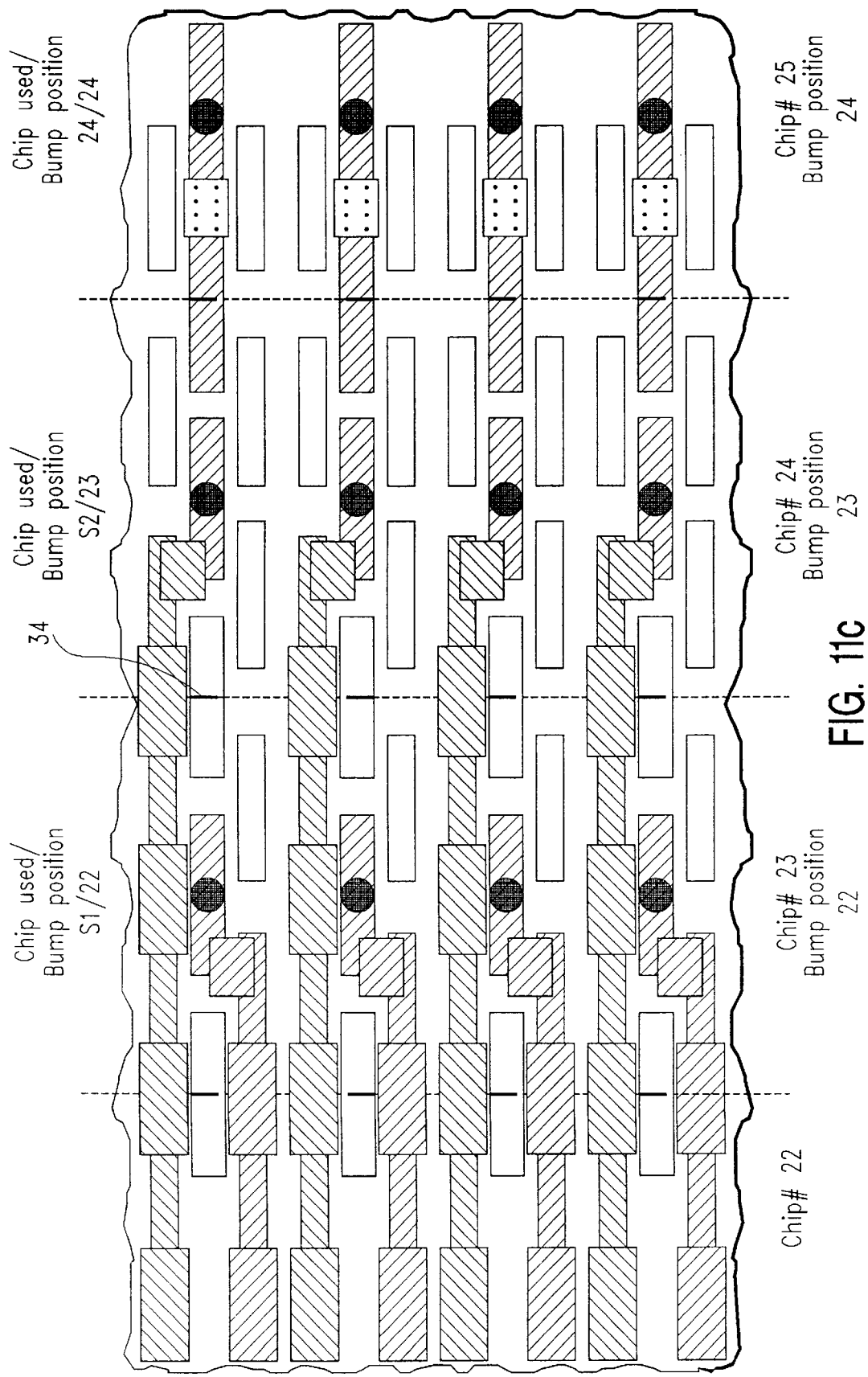
Figure 12A:
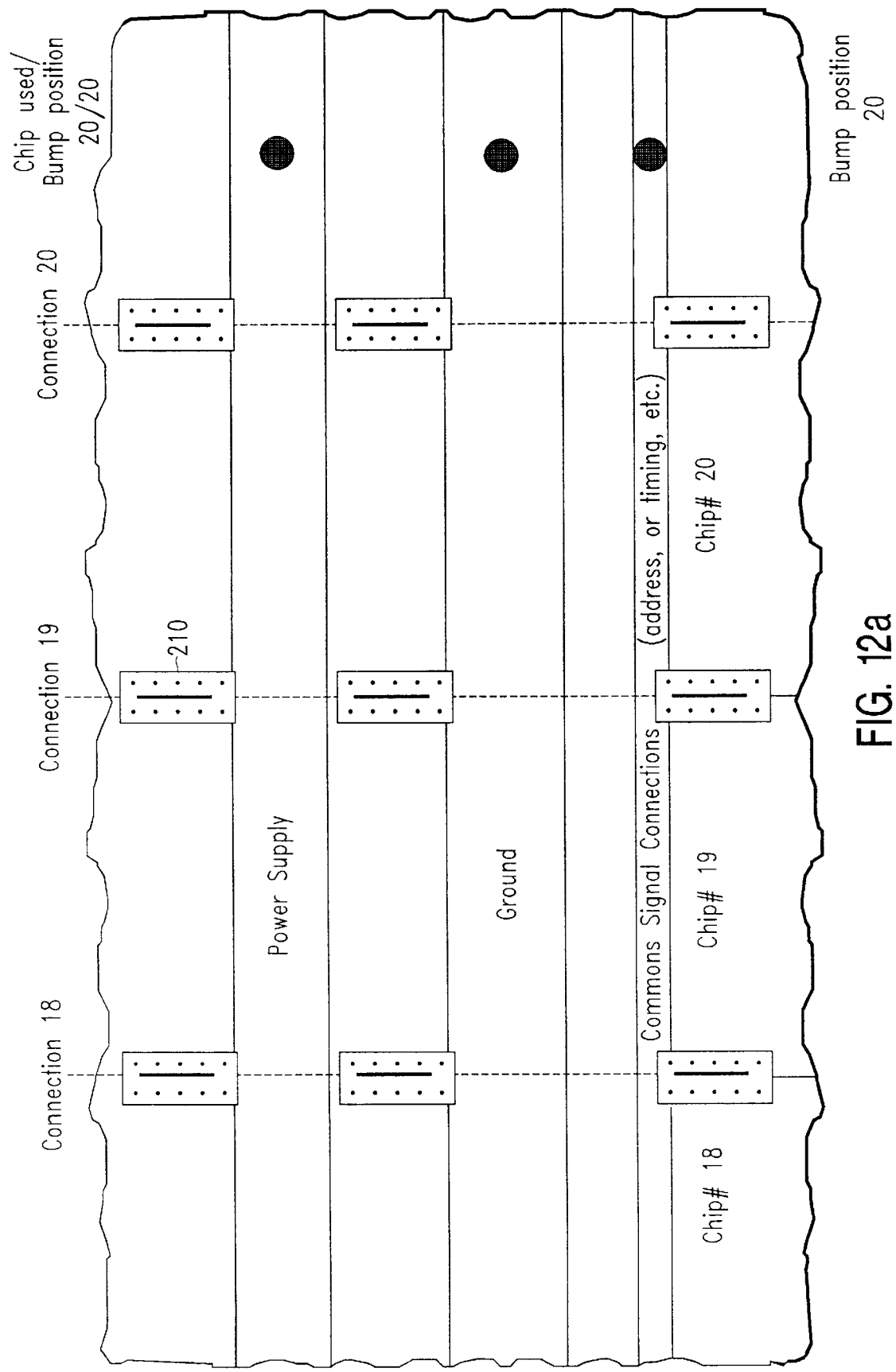
FIGS. 12a–12c show common connections for the embodiment of FIGS. 11a–11c.
Figure 12B:
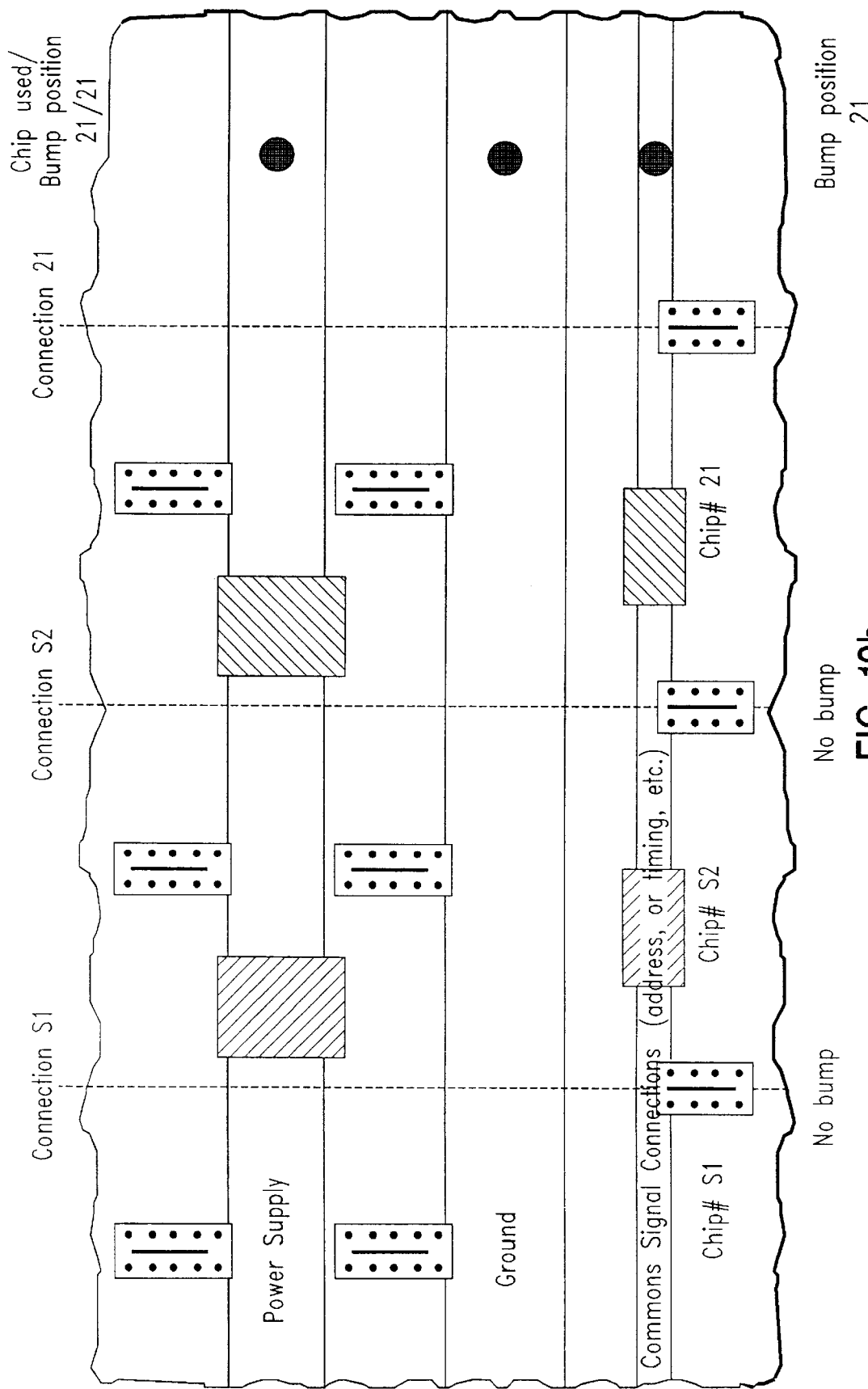
Figure 12C:
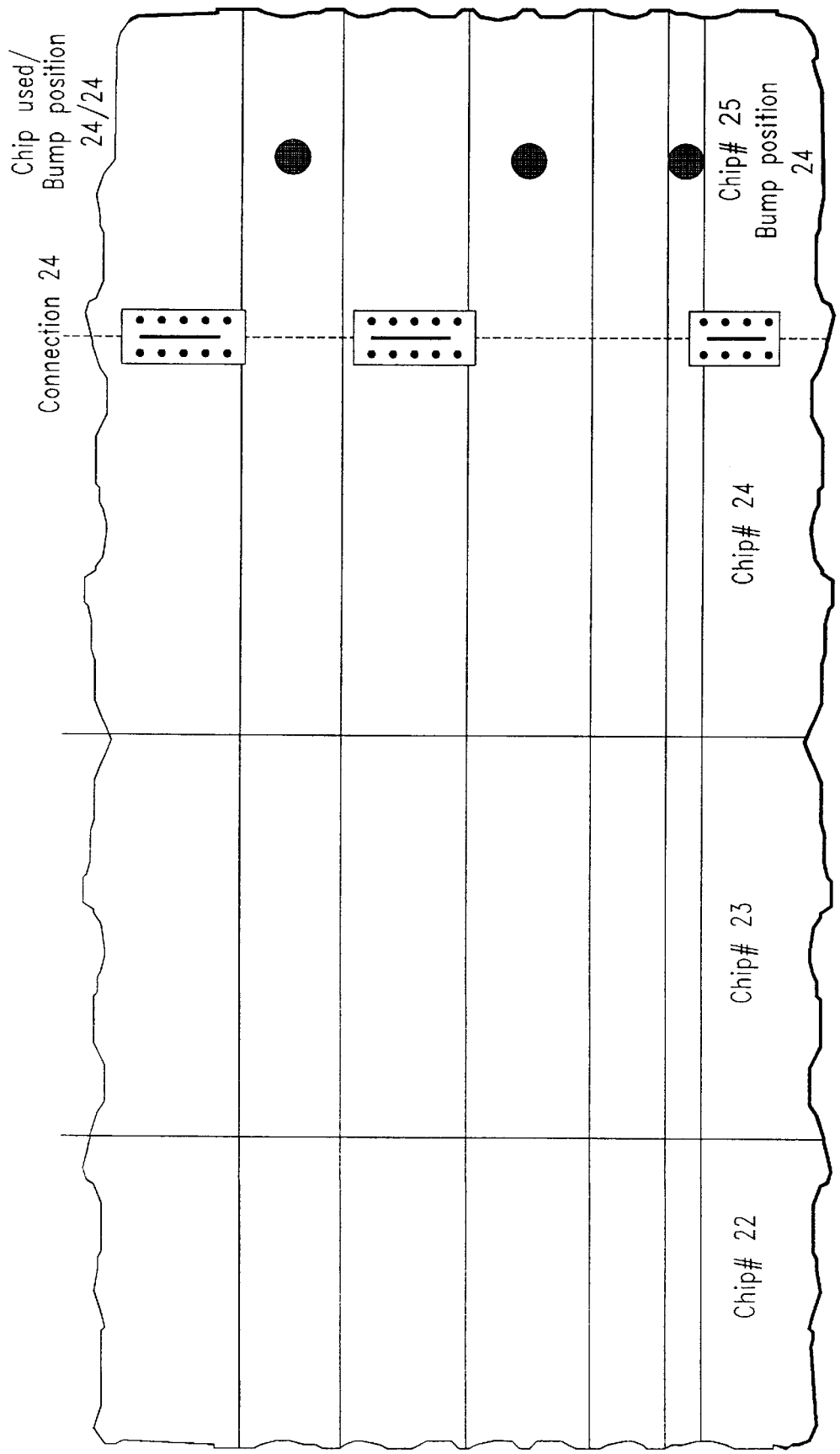

FIG. 11a shows an alternative layout in which pad 90b and solder ball 92 have been translated to position 90b' between chip edges. A separate pad connection 202 is connected to the chip active layer. A shape 200 determines whether the 90b' will be connected to 202. If shape 200 is omitted, then no connection is made to the adjacent chip at that location. It is now possible to use a configuration such as layer 32' of FIG. 1c', connecting directly to pad 42'. The means of connecting spare chips to bad chip sites for substitution is shown in FIG. 11a–11c, and is similar to that shown for FIGS. 4a–4c. FIGS. 11a–11c describe individual terminal connections. In cases where two or more terminals are common, shapes of various sizes, such as 210 of FIG. 12a are used to connect to good chips. Chips can be omitted by not stepping shape 210. An example is shown in FIG. 12c where chip numbers 22 and 23 are not connected (except ground which is connected to all chips). Also, the solder bumps are distributed over the length of the connecting segment, and less than one per chip location is shown in this example.

Figure 13A:
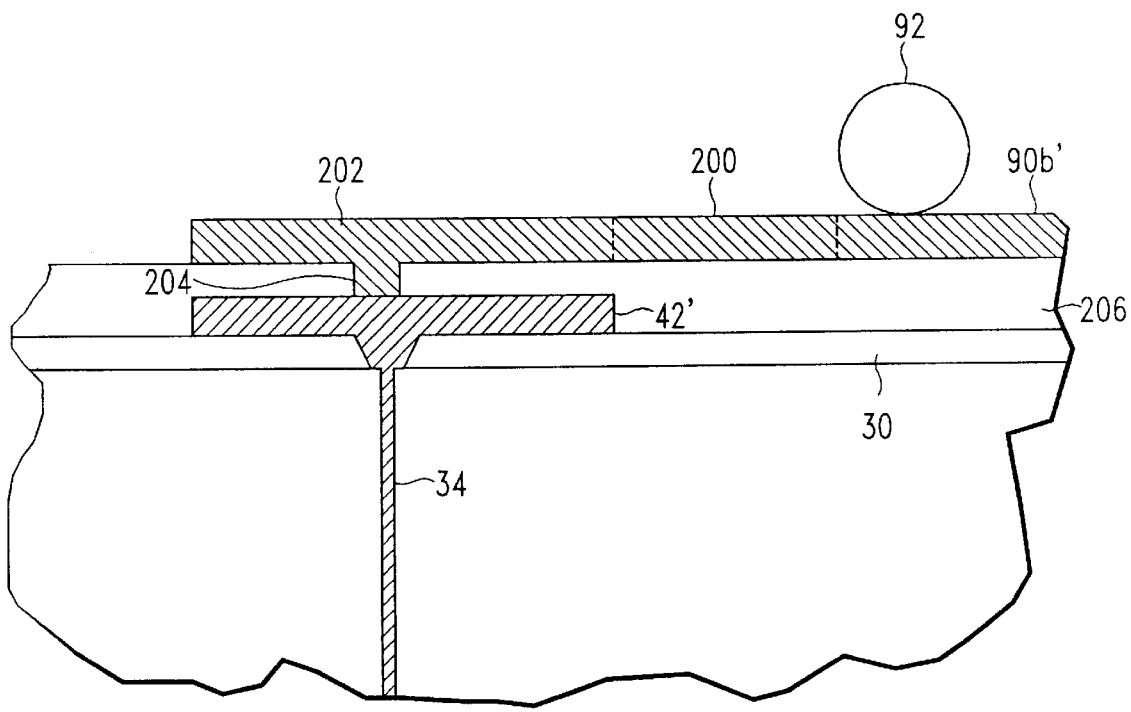
FIGS. 13a–b are cross sectional views of alternate embodiments for achieving the patterns of FIGS. 11a–11c.
Figure 13B:
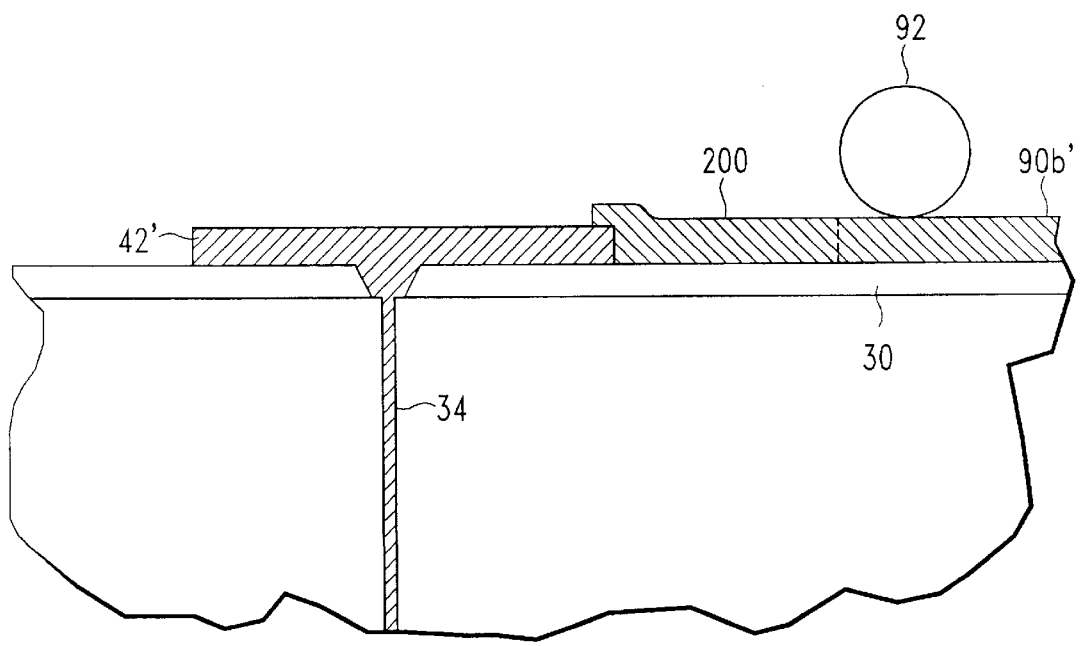

FIG. 13a and 13b show cross sections of two ways of achieving the patterns in FIG. 11a–11c. In FIG. 13a, the FIG. 1b transfer wiring 34 connects to pad 42' on side face 32' of FIG. 1c'. Pad 42' is on insulator 30 (FIG. 1b). A second layer of insulation 206 is used, and a via hole 204 connects pad 42' to pad 202 of FIG. 11a. Segment 200 connects pad 202 to pad 90b', and bump 92 provides connection to the next level of assembly. FIG. 13b takes advantage of the simple structure of FIG. 1c' and applies the second metal layer directly on the first layer metal 42', without any additional dielectric and vias required. In this case, pad 202 of FIG. 11a is the same as pad 42' of FIG. 1c' Segments 200, 90b' and bump 92 are connected as shown. FIG. 11a and 11b provide the same electrical connection.

The techniques for connecting pads on side face 32 described hereinabove can be used to make connections among circuit elements along any surface, such as the planar surface of a wafer, a single chip, or a planar array of chips. Such wiring can selectively interconnect or disconnect pads on these surfaces. For example, for a single chip, the technique can be used to interconnect circuit subfunctions (macros) or to spare circuits that are found to be defective. For the same purposes the wiring can be used to interconnect the separate chips of a planar array of chips or the separate circuits on individual chips or on the separate chips of a wafer.

To provide wiring among a planar array of chips, spaces between chips are filled with a dielectric material, such as polyimide which is spray applied so that wiring can be supported. It can also be spun on to provide a more uniform coating. The gap between chips is set (about 10 to 20 um) to be no larger than about twice the thickness of the layer of polyimide (5 to 10 um) applied. Thus, the polyimide serves both as gap filler and as the dielectric for the chip surfaces. The need for subsequent planarization is avoided. In the next step, vias are opened in the dielectric and metal is applied, as described above to provide interconnections, or fuses are blown to provide disconnections.

Thus, the present invention provides a method of fabricating a semiconductor structure in which the structure is tested after a portion of the fabrication is completed. Later portions of the structure are then fabricated based on the results of that test. The later portions include a metallization pattern tailored to avoid circuit elements that were found to be defective in the test. The tailored metallization can also be provided to provide an architecture that takes advantage of specific electrical properties found in the test. For example, memory chips that have high Idd leakage current may be arranged in a by four configuration while those with low Idd leakage can be selected to be arranged in a by 16 configuration. By providing schemes for tailoring metallization after test, the present invention allows wiring to be reconfigured on the fly, without resort to new masks to take best advantage of test results to improve yield or functionality.

The tailorable metallization of the present invention also provides a scheme for rapidly creating or altering circuit configurations; in essence application specific integrated circuits are quickly fabricated by selecting and deselecting circuits with the metallization tailoring methods disclosed herein. While it would be advantageous to test circuit elements first to ensure the functionality of the included circuits before finalizing the metallization, these ASIC circuits could also be built with the tailorable wiring of the present invention without the intermediate test. The wiring can be tailored by methods such as opening fuses, providing ribbon connections, providing bump connections, or providing photolithographically formed shapes as described herein above. In this case, defective circuits would be included and would result in yield loss but other functional chips would be fabricated in much less time than would be required to provide masks.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A wiring structure for configuring integrated circuit elements to avoid defective elements, comprising:
   m integrated circuit elements, wherein a portion of said elements are defective;
   a first arrangement of m pads, each of said m pads having a link to one of said integrated circuit elements;
   a second arrangement of n pads, m being greater than n, each of said n pads being connected to one of said m pads, each of said n pads of said second arrangement of pads in a fixed location; and
   a tailorable wiring level for connecting any n of said m pads of said first arrangement of pads to said n pads of said second arrangement of pads to avoid said defective elements.

2. A semiconductor structure as recited in claim 1, wherein said integrated circuit elements comprise an array of separate integrated circuit chips.

3. A semiconductor structure as recited in claim 2, wherein said array of separate integrated circuit chips comprises a stack of chips.

4. A semiconductor structure as recited in claim 3, wherein said stack of chips comprises a bread loaf stack.

5. A semiconductor structure as recited in claim 3, wherein said stack of chips comprises a pancake stack.

6. A semiconductor structure as recited in claim 1, wherein said integrated circuit elements comprise arrays of circuits on a single integrated circuit chip.

7. A semiconductor structure as recited in claim 6, wherein said arrays of circuits comprise logic blocks or macros.

8. A semiconductor structure as recited in claim 6, wherein said arrays of circuits comprise memory arrays.

9. A semiconductor structure as recited in claim 1, wherein said integrated circuit elements comprise at least one spare integrated circuit element, said tailorable wiring level for replacing one said IC element with said spare IC element.

10. A semiconductor structure as recited in claim 9, wherein said integrated circuit elements and said at least one spare integrated circuit element comprise separate integrated circuit chips.

11. A semiconductor structure as recited in claim 1, wherein said link is a tailorable link.

12. A semiconductor structure as recited in claim 1, wherein said second arrangement of pads is for external connection.

13. A semiconductor structure as recited in claim 1, wherein said tailorable wiring is a level of metal on said first arrangement of pads, there being no patterned insulation level there between.

14. A semiconductor structure as recited in claim 1, wherein said tailorable wiring is on a side face of a stack of chips.

15. A semiconductor structure as recited in claim 1, wherein said tailorable wiring is on an interposer for connection to said first arrangements of pads.

16. A semiconductor structure as recited in claim 1, wherein said tailorable wiring comprises deletable links.

17. A semiconductor structure as recited in claim 16, wherein said tailorable wiring comprises tailorable links.

18. A semiconductor structure as recited in claim 16, wherein said tailorable links comprise fusible links.

19. A semiconductor structure as recited in claim 1, wherein said tailorable wiring comprises bump connectors.

20. A semiconductor structure as recited in claim 1, wherein said tailorable wiring comprises ribbon bonds.

21. A semiconductor structure as recited in claim 1, wherein said tailorable wiring comprises photolithographically added line segments.

22. A semiconductor structure as recited in claim 1, wherein said first arrangement of pads has fusible links to subtract unwanted routing connections and said tailorable wiring adds wanted routing connections, the two layers in combination providing means for disconnecting a defective chip and connecting a wanted chip.

* * * * *